United States Patent
Cavin

(10) Patent No.: US 8,552,770 B2
(45) Date of Patent: Oct. 8, 2013

(54) FREQUENCY DIVIDER WITH SYNCHRONOUS RANGE EXTENSION ACROSS OCTAVE BOUNDARIES

(75) Inventor: Mark S. Cavin, Austin, TX (US)

(73) Assignee: Coherent Logix, Incorporated, Austin, TX (US)

( * ) Notice: Subject to any disclaimer, the term of this patent is extended or adjusted under 35 U.S.C. 154(b) by 0 days.

(21) Appl. No.: 13/356,995

(22) Filed: Jan. 24, 2012

(65) Prior Publication Data

US 2012/0194220 A1 Aug. 2, 2012

Related U.S. Application Data

(60) Provisional application No. 61/437,126, filed on Jan. 28, 2011.

(51) Int. Cl.
*H03K 21/00* (2006.01)

(52) U.S. Cl.
USPC .............................. 327/115; 327/117; 377/47

(58) Field of Classification Search
USPC .......................... 327/113–115, 117–118, 551; 377/47–48; 326/104
See application file for complete search history.

(56) References Cited

U.S. PATENT DOCUMENTS 7,109,762 B2  9/2006  Neurauter et al.
7,298,810 B2 * 11/2007 Ke .................................. 377/48

OTHER PUBLICATIONS

International Search Report for Application No. PCT/US2012/022364, mailed May 10, 2012; 3 pages.
Yang, et al; "A Quantization Noise Suppression Technique for Delta-Sigma Fractional-N Frequency Synthesizers"; IEEE Journal of Solid-State Circuits; IEEE Service Center, Piscataway, NJ, USA; vol. 41, No. 11, Nov. 1, 2006; pp. 2500-2511; XP011149848.
Fahim, et al; "A Wideband Sigma-Delta Phase-Locked-Loop Modulator for Wireless Applications"; IEEE Transactions on Circuits and Systems II: Analog and Digital Signal Processing/ISSN 1057-7130>VN 8090B, Institute of Electrical and Electronics Engineers Inc., 345 East 47 Street, New York, N.Y. 10017, USA; vol. 50, No. 2; Feb. 1, 2003; XP011071644.
Eissa, et al; "A Technique for Robust Division Ratio Switching in Multi Modulus Dividers with Modulus Extension"; Microelectronics (ICM), 2010 International Conference on IEEE, Piscataway, NJ, USA; Dec. 19, 2010; pp. 84-87; XP031856156.
Vaucher, et al: A Family of Low-Power Truly Modular Programmable Dividers in Standard 0.35-um CMOS Technology, IEEE Journal of Solid-State Circuits; vol. 35, No. 7; Jul. 1, 2000; pp. 1039-1045.

* cited by examiner

*Primary Examiner* — Long Nguyen
*Assistant Examiner* — Thomas Skibinski
(74) *Attorney, Agent, or Firm* — Meyertons Hood Kivlin Kowert & Goetzel, P.C.; Jeffrey C. Hood

(57) ABSTRACT

A frequency divider based on a series of divide-by-2/3 cells and divide-by-1/2/3 cells using extended division range is disclosed. The frequency divider uses modified divide-by-1/2/3 cells and additional circuit elements to correctly divide an input frequency by a divisor on successive output cycles while the divisor transitions across an octave boundary. The frequency divider creates a divide-by-1 mode for unused divide-by-1/2/3 cells in the series of cells. The divide-by-1 mode passes the input clock in the unused latches of each unused divide-by-1/2/3 cell as opposed to having each unused divide-by-1/2/3 cell implement divide-by-3 mode.

20 Claims, 20 Drawing Sheets

Frequency Divider with Divisor Range 4-to-15

Divide by 2 mode

Divide by 3 mode

Truth Table for Divisor with Range 4-to-15

| Divisor | P<3> | P<2> | P<1> | P<0> | mod2in | Stage 3 Divisor |
|---|---|---|---|---|---|---|
| 4 | 0 | 1 | 0 | 0 | 1 | 3 |
| 5 | 0 | 1 | 0 | 1 | 1 | 3 |
| 6 | 0 | 1 | 1 | 0 | 1 | 3 |
| 7 | 0 | 1 | 1 | 1 | 1 | 3 |
| 8 | 1 | 0 | 0 | 0 | mod2 | 2 |
| 9 | 1 | 0 | 0 | 1 | mod2 | 2 |
| 10 | 1 | 0 | 1 | 0 | mod2 | 2 |
| 11 | 1 | 0 | 1 | 1 | mod2 | 2 |
| 12 | 1 | 1 | 0 | 0 | mod2 | 3 |
| 13 | 1 | 1 | 0 | 1 | mod2 | 3 |
| 14 | 1 | 1 | 1 | 0 | mod2 | 3 |
| 15 | 1 | 1 | 1 | 1 | mod2 | 3 |

Divide-by-1/2/3 Circuit Diagram

Truth Table for Divide-by-1/2/3 Circuit

| Div1 | P | $mod_{in}$ | Divisor |
|---|---|---|---|
| 0 | 0 | 0 | 2 |
| 0 | 0 | 1 | 2 |
| 0 | 1 | 0 | 2 |
| 0 | 1 | 1 | 3 |
| 1 | X | X | 1 |

Divide-by-1 mode

Frequency Divider with Divisor Range 4-to-15

Truth Table for Divider with Range 4-to-15

| Divisor | P<3> | P<2> | P<1> | P<0> | mod2in | Div1 | Stage 3 Divisor |
|---|---|---|---|---|---|---|---|
| 4 | 0 | 1 | 0 | 0 | 1 | 1 | 1 |
| 5 | 0 | 1 | 0 | 1 | 1 | 1 | 1 |
| 6 | 0 | 1 | 1 | 0 | 1 | 1 | 1 |
| 7 | 0 | 1 | 1 | 1 | 1 | 1 | 1 |
| 8 | 1 | 0 | 0 | 0 | mod2 | 0 | 2 |
| 9 | 1 | 0 | 0 | 1 | mod2 | 0 | 2 |
| 10 | 1 | 0 | 1 | 0 | mod2 | 0 | 2 |
| 11 | 1 | 0 | 1 | 1 | mod2 | 0 | 2 |
| 12 | 1 | 1 | 0 | 0 | mod2 | 0 | 3 |
| 13 | 1 | 1 | 0 | 1 | mod2 | 0 | 3 |
| 14 | 1 | 1 | 1 | 0 | mod2 | 0 | 3 |
| 15 | 1 | 1 | 1 | 1 | mod2 | 0 | 3 |

Static simulation comparison of 4-15 dividers

Comparison of 4-15 dividers randomly hopping between 4-7

Comparison of 4-15 dividers randomly hopping between 8-11

FIG. 15 Comparison of 4-15 dividers randomly hopping between 7-8

Comparison of 4-15 dividers randomly hopping between 6-9

FIG. 17 Comparison of 4-15 dividers randomly hopping between 4-11

Divider With Divisor Range 16-to-255

US 8,552,770 B2

FREQUENCY DIVIDER WITH SYNCHRONOUS RANGE EXTENSION ACROSS OCTAVE BOUNDARIES

PRIORITY INFORMATION

This application claims benefit of priority of U.S. Provisional Application Ser. No. 61/437,126 titled "Frequency Divider with Synchronous Range Extension Across Octave Boundaries" filed Jan. 28, 2011, whose inventor was Mark S. Cavin, which is hereby incorporated by reference in its entirety as though fully and completely set forth herein.

FIELD OF THE INVENTION

The present invention relates generally to frequency dividers, and in particular to a circuit apparatus for dividing an input signal with synchronous range extension across octave boundaries.

DESCRIPTION OF THE RELATED ART

Multi-modulus Dividers (MMD) are used in fractional-N synthesizers to vary the divisor value each crystal reference cycle such that on average, non-integer values can be synthesized. FIG. 1 shows an example MMD application in a phase locked loop (PLL). PLL 100 includes voltage controlled oscillator (VCO) 160 and crystal reference oscillator 110. VCO 160 is divided in frequency by N (in block 180) and crystal reference oscillator 110 is divided in frequency by R (in block 120). The output frequency (Fout) is a function of the divider values (R and N) and the reference frequency (Fref), such that (Fout=Fref*(N/R)). In many applications, Fout and Fref are fixed leading to the divider divisor requirement. In addition, often R=1 for phase noise and reference spur requirements, leading to a fixed requirement for N. As Fout varies from channel to channel and Fout and Fref vary from system to system, N varies accordingly. For wide band, multi-standard, software defined, and cognitive radios, operation of a divider over a large range of N is desirable. Due to the non-integer relationship between Fout and Fref, correct divider operation during divider dithering or programming word variation is required. Otherwise incorrect average frequencies and spurs would result. Delta sigma modulation is one possible means of varying the divider values to effectively synthesize a non-integer MMD divisor.

A commonly used MMD architecture was first published in "A Family of Low-Power Truly Modular Programmable Dividers in Standard 0.35-um CMOS Technology," by Cicero Vaucher in the IEEE Journal of Solid-State Circuits in July 2000, and is shown in FIG. 2A. The basic architecture consists of a cascade of divide-by-2/3 cells. The overall circuit will divide by values of $2^n$ to $(2^{n+1}-1)$, where n is the number of 2/3 cells. This range is almost one octave. As used herein, the term 'octave' refers to the interval between a first frequency and a second frequency, wherein the second frequency is half or double the first frequency. For example, if n=4 then the FIG. 2A divider would be capable of dividing by a range of 16-to-31. If more than an octave range is desired then the circuit of FIG. 2B can be used to add "extended division range". The "OR" gates allow the division range to be extended to $2^{n'}$ to $(2^{n+1}-1)$ where n' is the number of 2/3 cells without the "or" gates and n is the total number of 2/3 cells. If n'=3 and n=5 then a division range of 8-to-63 could be achieved, which is three octaves.

The architecture based on the cascade of divide-by-2/3 cells has several advantages. Since the 2/3 cells are not all clocked in parallel or at the same frequency, current can be scaled down in successive stages. The dominant current consumption and the most stringent timing will be restricted to the first stage, similar to a ripple divider. But unlike a ripple divider, there is an output near the first stage which is clocked at high frequency. This has phase noise advantages as opposed to using an output at the back end of the cascade where slew rates are lower and jitter can be accumulated. In general the output of FIG. 2A could be taken at any of the modout signals or Fo$_n$. They all have frequency equal to Fin/N, where N is the divider programmed word.

The circuit elements of the Vaucher MMD divide-by-2/3 cells are shown in FIGS. 3-6, starting with simple divide-by-2 circuits in FIGS. 3A-C. FIG. 3A shows a circuit diagram of D flip-flop 310 used to create a divide-by-2 circuit. FIG. 3B shows a circuit diagram of a different implementation used to create a divide-by-2 circuit. Master latch (320) and slave latch (330) are used to create a divide-by-2 circuit that is positive-edge triggered. FIG. 3C shows a circuit diagram of a third implementation used to create a divide-by-2 circuit. Master latch (340) and slave latch (350) are used to create a divide-by-2 circuit that is negative-edge triggered. FIGS. 3A-C may be referred to as "Johnson counters" since the output of the last latch is inverted and fed back as an input to the first latch.

FIGS. 4A-B illustrate two different examples of divide-by-3 circuits. FIG. 4A shows a circuit diagram of a divide-by-3 circuit implemented with two D flip-flops (415 and 420) and a two-input AND gate 410. FIG. 4B shows a different implementation of a divide-by-3 circuit, using master latches 460 and 475, slave latches 465 and 470, and two-input AND gate 455. FIG. 4B illustrates a negative-edge triggered implementation of a divide-by-3 circuit, such that the output frequency ($f_{out}$) will only transition on the negative edges of the input frequency ($f_{in}$).

FIG. 5A illustrates a circuit diagram of a divide-by-2/3 cell used in the architecture described by Vaucher. Circuit 500 may divide the input frequency ($f_{in}$) by a divisor of either two or three to generate the output frequency ($f_{out}$). Two control nodes, modulus control input (mod$_{in}$) and programming input (P), determine the selection of the divisor for circuit 500. Circuit 500 includes two master latches (515 and 535), two slave latches (520 and 525), and three two-input AND gates (510, 530, and 540). Master latches 515 and 535 are enabled when the input clock (port label CK) is high (i.e., logic '1', Vcc), and slave latches 520 and 525 are enabled when the input clock is low (i.e., logic '0', ground (GND)).

FIG. 5B illustrates a truth table for circuit 500 of FIG. 5A. The truth table 550 contains columns for control signals P and mod$_{in}$ and for the divisor. The divisor represents the value (either 2 or 3) the input frequency of circuit 500 will be divided by to generate the output frequency.

FIG. 6A illustrates a divide-by-2/3 cell set to divide-by-2 mode. In divide-by-2 mode, either signal mod$_{in}$ or P or both are set to '0', which sets the divisor of circuit 600 as '2'. If control signal mod$_{in}$ is '0', then the signal passing through master latch 635, AND gate 630, and into port D of slave latch 625 will be '0'. If control signal P is '0', then the signal passing through AND gate 630 and into port D of slave latch 625 will be '0'. In either case, the signal output from port Qb of slave latch 625 will be '1'. Port Qb of slave latch 625 connects to one of the inputs of AND gate 610, and so if Qb of slave latch 625 is '1', then circuit 600 will function as though latches 625 and 635 were not part of circuit 600, and as if the Qb port of latch 620 were directly connected to the D port of latch 615. In this case, circuit 600 will behave like the functional equivalent of the circuit from FIG. 3C.

FIG. 6B illustrates a divide-by-2/3 cell set to divide-by-3 mode. The signals $mod_{in}$ and P are both set to '1', which sets the divisor of circuit 650 as '3'. Since control signals $mod_{in}$ and P are both '1', circuit 650 will behave like the functional equivalent of the circuit in FIG. 4B.

FIG. 7 shows a schematic diagram of a divider with range 4-to-15 as described by Vaucher. Divider 700 is a two octave divider utilizing the "extended division range" technique of FIG. 2B. Divider 700 includes three stages of division, and each stage includes a divide-by-2/3 cell. Each divide-by-2/3 cell has five nodes, which include a first input node (fin), a second input node ($mod_{in}$), a third input node (P), a first output node (Fo23), and a second output node ($mod_{out}$). The fin node of the first divide-by-2/3 cell (710) is coupled to the frequency input to divider 700. The Fo23 node of cell 710 is coupled to the fin node of the second divide-by-2/3 cell (715). The fin node of each stage is coupled to the Fo23 node of the preceding stage. The mod node of cell 710 is coupled to the $mod_{out}$ node of cell 715. The $mod_{out}$ node of cell 725 is coupled to an input to the two-input OR gate 720. The other input of OR gate 720 is coupled to inverted control signal P3.

FIG. 7B illustrates a truth table for divider 700 (of FIG. 7A) with divisor range 4-to-15. Truth table 750 includes columns for the divisor, signals P0-P3, mod2in, and the stage 3 divisor. The divisor takes on all integer values from 4 to 15 in truth table 750.

FIG. 8 shows a schematic diagram of a divider chain with an extended division range. The schematic diagram in FIG. 8 is described by Neurauter et al. in U.S. Pat. No. 7,109,762 "Frequency-Dividing Circuit Arrangement and Phase Locked Loop Employing such Circuit Arrangement". Divider 800 has a divisor range of 4-to-15. Divider 800 has four division cells 852, 860, 868, and 876. The first two cells (852 and 860) of the divider chain are divide-by-2/3 cells and the last two cells (868 and 876) are divide-by-1/2/3 cells. Divider 800 also includes AND gates 854, 856, 862, 864, 870, 872, 878, and 880 and inverters 858, 866, 874, and 882. By using divide-by-1/2/3 cells for the last two cells instead of divide-by-2/3 cells, divider 800 is able to extend the divisor range to greater than an octave. The divisor range of a divider described by Neurauter is extended to the range of $2^j$ to $(2^i-1)$, where 'j' represents the number of divide-by-2/3 cells and 'i' represents the total number of divide-by-2/3 cells and divide-by-1/2/3 cells. Therefore, for circuit 800 of FIG. 8, 'j' is two and 'i' is four and the divisor range is 4-to-15.

However, there is a problem with using the architecture from FIGS. 2B, 7A or 8 in a fractional-N synthesizer. Although the range extension logic works in a static sense or with fixed divider programming, if the divisor is changed across an octave boundary, there is a phase discontinuity due to the asynchronous nature of the range extension or "extended division range" operation. As a result, undesired division takes place if the divider is programmed to cross the boundary between any $(2^n-1)$ and $2^n$ state. So for the divider with range 8-to-63 shown in FIG. 2B, problems exist when programming or hopping across the 15-to-16 and 31-to-32 boundaries. For the dividers with range 4-to-15 in FIG. 7A and FIG. 8, problems exist when transitioning across the 7-to-8 octave boundary. In a fractional-N synthesizer this would mean that average divisors requiring these values would have to be avoided, resulting in holes in the frequency plan or the need for alternate crystal reference frequency schemes.

In view of the above, improved methods and mechanisms for implementing frequency dividers with extended division range are desired.

SUMMARY OF THE INVENTION

Various embodiments of mechanisms for implementing a frequency divider are contemplated. In one embodiment, a frequency divider includes a series of divide-by-2/3 cells and divide-by-1/2/3 cells coupled together. The series of divide-by-2/3 cells and divide-by-1/2/3 cells may be cascaded together to create an extended division range for the frequency divider, such that the extended division range spans more than one octave. The effective range of possible divisor values N may be determined by the formula $2^j \leq N \leq (2^{(i+1)}-1)$, wherein j represents the number of divide-by-2/3 cells and wherein i represents the total number of divide-by-2/3 cells and divide-by-1/2/3 cells. Any number of divide-by-2/3 cells and divide-by-1/2/3 cells may be cascaded together to create a frequency divider with a preferred division range.

The divider circuit including the series of divide-by-2/3 cells and divide-by-1/2/3 cells may be designed such that the circuit does not suffer from any discontinuities while transitioning across a $(2^n-1)$-to-$2^n$ octave boundary, wherein n is a positive integer. The divider circuit may correctly divide by the value specified by a programming word even while the programming word is transitioning across an octave boundary on successive clock cycles.

For each divide-by-1/2/3 cell in the series of cells, the divider circuit may include a corresponding latch, inverter gate, and two-input OR gate. A Div1 node of the divide-by-1/2/3 cell may be coupled to a first input node of the two-input OR gate and to a Qb node of the latch. A $mod_{out}$ port of each divide-by-1/2/3 cell may be coupled to a second input node of the two-input OR gate and to the input node of the inverter gate. The output node of the inverter gate may be coupled to a clock port of the latch. The P control signal corresponding to the subsequent divide-by-1/2/3 cell may be coupled to the D node of the latch. Also, a $mod_{in}$ port of each divide-by-1/2/3 cell may be coupled to an output node of the two-input OR gate corresponding to a subsequent divide-by-1/2/3 cell. For the last divide-by-1/2/3 cell in the series of cells, the $mod_{in}$ port may be coupled to a high logic level.

For frequency dividers with more than one divide-by-1/2/3 cell in the series of cells, there may an additional series of two-input OR gates included as part of the frequency divider. The two highest P control signals corresponding to the two MSB's of the programming divisor word may be coupled to the input nodes of a first two-input OR gate. The output of the first two-input OR gate may be coupled to an input node of a second two-input OR gate and to the D node of the latch corresponding to the next to last divide-by-1/2/3 cell in the series of cells. The third MSB of the P control signals may be coupled to the other input of the second two-input OR gate. This arrangement of the series of two-input OR gates and corresponding signals may continue for the plurality of divide-by-1/2/3 cells and associated circuit elements.

The frequency divider described herein may be utilized in a variety of applications, including as a prescaler or multi-modulus divider (MMD). The frequency divider may also be utilized in a frequency synthesizer, phase locked loop (PLL), fractional-N frequency synthesizer, receiver, transmitter, or transceiver. The frequency divider may also be utilized as part of a radio, including a multi-standard or multi-mode radio, cognitive radio, or software defined radio (SDR).

These and other features and advantages will become apparent to those of ordinary skill in the art in view of the following detailed descriptions of the approaches presented herein.

BRIEF DESCRIPTION OF THE DRAWINGS

A better understanding of the present invention can be obtained when the following detailed description is considered in conjunction with the following diagrams, in which.

Figure 1:
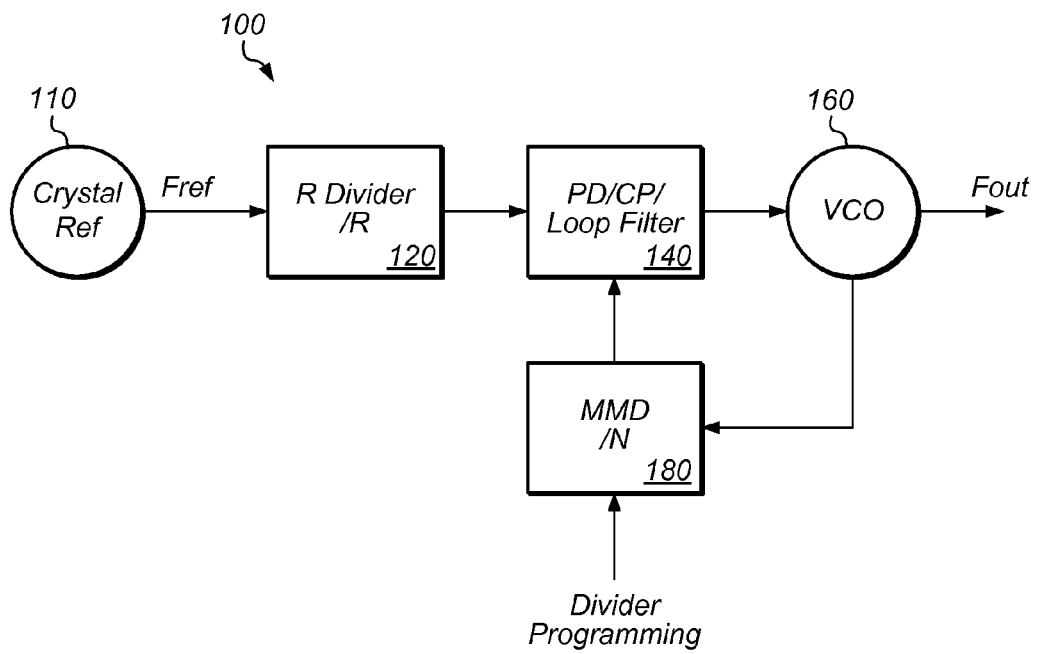
FIG. 1 is an illustration of a prior art multi-modulus divider (MMD) application in a phase locked loop (PLL).
Figure 2A:
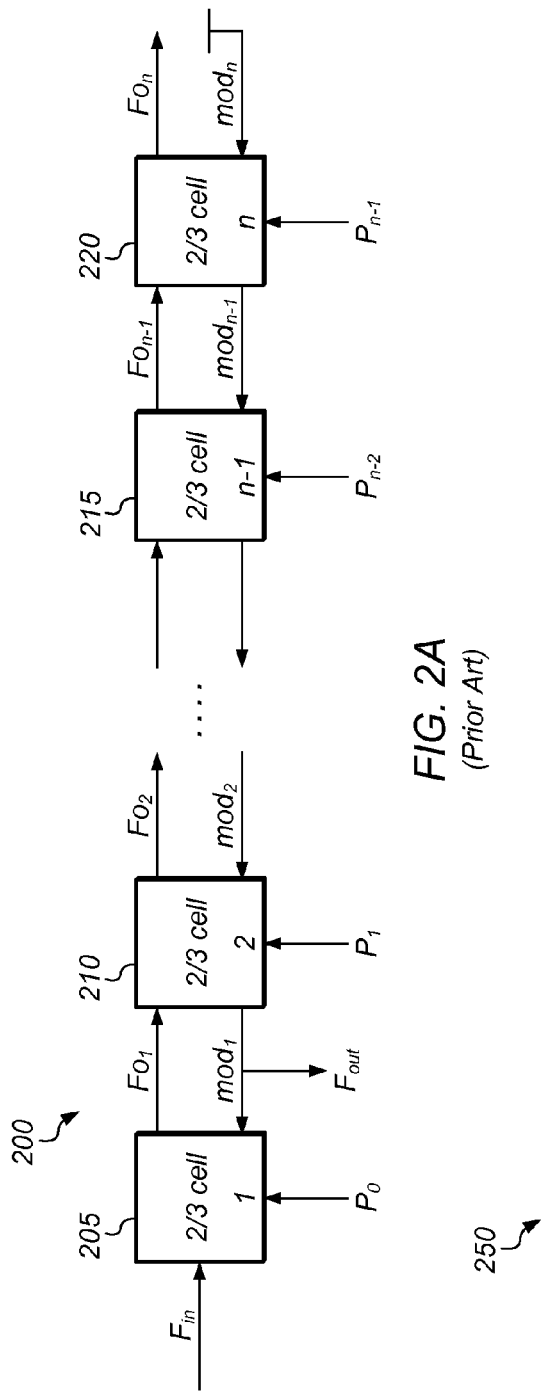
FIG. 2A illustrates a commonly used MMD architecture, according to the prior art.
Figure 2B:
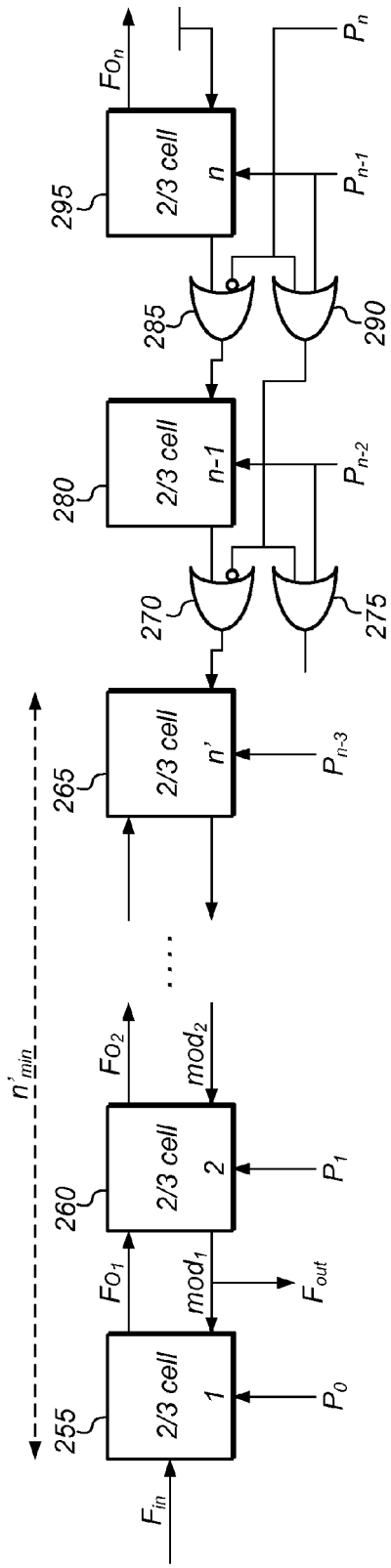
FIG. 2B illustrates a MMD with an extended division range, according to the prior art.
Figure 3A:
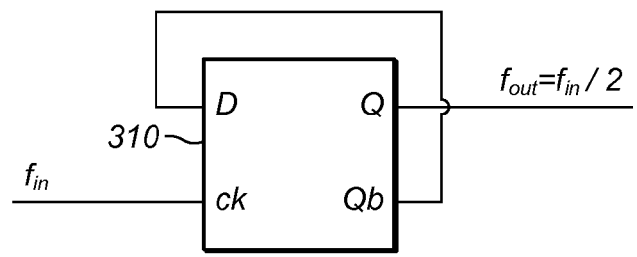
FIG. 3A illustrates a circuit diagram of a prior art divide-by-2 circuit.
Figure 3B:
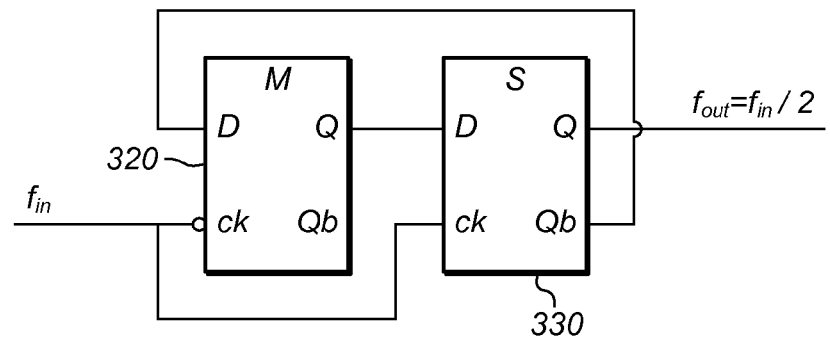
FIG. 3B illustrates another circuit diagram of a prior art divide-by-2 circuit.
Figure 3C:
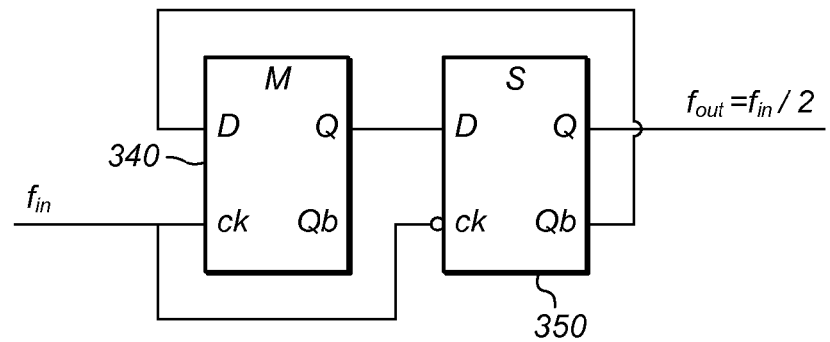
FIG. 3C illustrates another circuit diagram of a prior art divide-by-2 circuit.
Figure 4A:
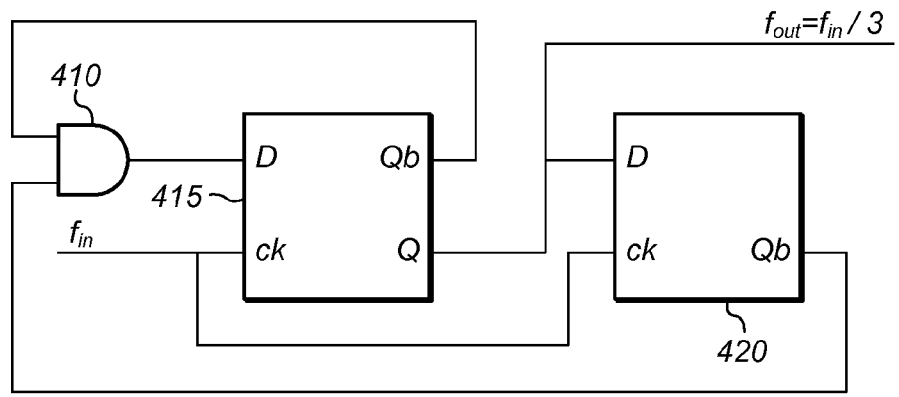
FIG. 4A illustrates a circuit diagram of a prior art divide-by-3 circuit.
Figure 4B:
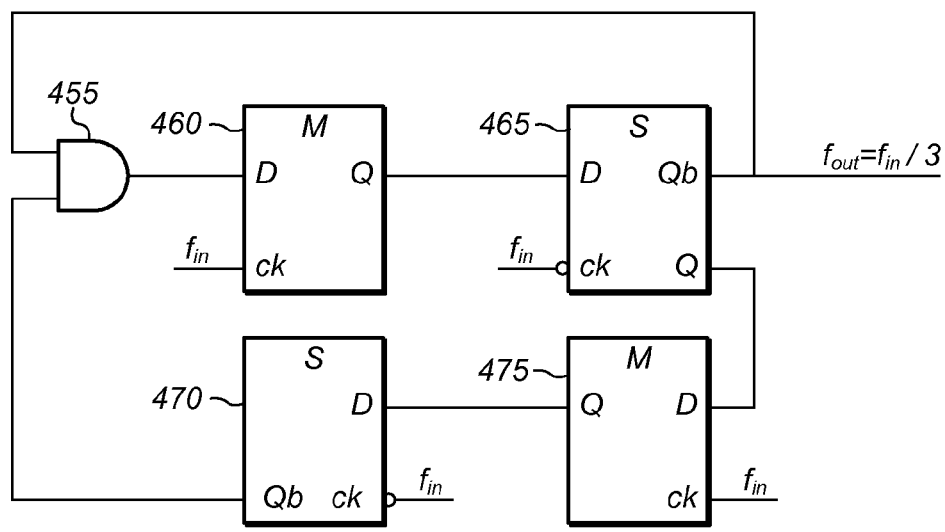
FIG. 4B illustrates another circuit diagram of a prior art divide-by-3 circuit.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Figures 9A, 9B:
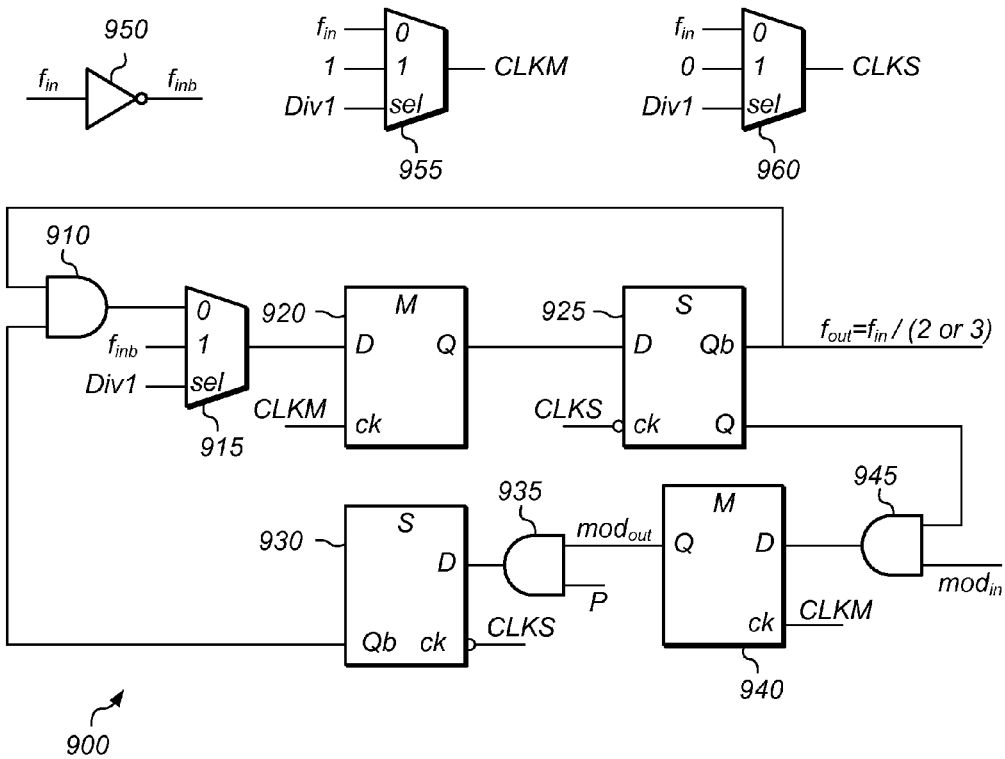
FIG. 9A illustrates a circuit diagram of a divide-by-1/2/3 circuit.
FIG. 9B illustrates a truth table for a divide-by-1/2/3 circuit.

FIG. 9A illustrates one embodiment of a circuit diagram of a divide-by-1/2/3 circuit. Divide-by-1/2/3 circuit 900 includes the following elements: three two-to-one multiplexers (915, 955, and 960), three two-input AND gates (910, 935, and 945), one inverter (950), two master latches (920 and 940), and two slave latches (925 and 930). The input nodes of circuit 900 include the following: an input frequency ($f_{in}$) and three control signals (Div1, $mod_{in}$, and P). The divisor of circuit 900 may be set by the three control signals. The output nodes of circuit 900 include the following: $f_{out}$ and $mod_{out}$. The $f_{out}$ node may output a signal with a frequency equal to the input frequency ($f_{in}$) divided by one, two, or three. The $mod_{out}$ node may be coupled to the $mod_{in}$ node of a preceding cell within a larger divider circuit composed of a series of divide by 2/3 and divide-by-1/2/3 cells.

The output of two-to-one multiplexer 955 is signal CLKM. Signal CLKM connects to node ck of master latches 920 and 940. The inputs to multiplexer 955 are the following: $f_{in}$ is coupled to the "0" node, logic '1' is coupled to the "1" node, and Div1 is coupled to the "sel" (select) node. The output of two-to-one multiplexer 960 is signal CLKS. Signal CLKS is coupled to node ck of slave latches 925 and 930. The inputs to multiplexer 960 are the following: $f_{in}$ is coupled to the "0" node, logic '0' is coupled to the "1" node, and Div1 is coupled to the "sel" node.

Master latches 920 and 940 are active high latches (i.e., the value coupled to input node (D) passes through to the output nodes (Q and Qb) when logic '1' is present at node ck). A convention used herein of appending a "b" to the end of a signal name signifies that the signal has been inverted. For example, the signal coupled to node Qb is the inverse of the signal coupled to node Q. Slave latches 925 and 930 are active low latches (i.e., the value coupled to input node (D) passes through to the outputs nodes (Q and Qb) when logic '0' is present at node ck).

The Qb node of slave latch 925 is coupled to one of the inputs of two-input AND gate 910, and the Qb node of slave latch 930 is coupled to the other input of AND gate 910. The output of AND gate 910 is coupled to the '0' node of multiplexer 915. The '1' node of multiplexer 915 is coupled to the output node of inverter 950, which is labeled "$f_{inb}$" in FIG.

9A. The 'sel' node of multiplexer 915 is coupled to input signal "Div1". The output node of multiplexer 915 is coupled to the D node of master latch 920.

Other structures and configurations of divide-by-1/2/3 circuits are possible and are contemplated. In another embodiment, the circuit elements in circuit 900 may be replaced individually or collectively with other functionally equivalent circuit elements. For example, latches 920-940 may be replaced by registers or flip-flops. Also, inverter 950 may be replaced by a two-input NAND gate with both inputs tied together. Other types of arrangements of circuit elements that are functionally equivalent to portions or the entirety of circuit 900 are possible and are contemplated. Divide-by-1/2/3 circuit 900 may be incorporated into a larger circuit with a series of divide-by-2/3 and divide-by-1/2/3 cells; the larger circuit may be used for dividing a clock frequency by an extended range of divisors.

Referring now to FIG. 9B, a truth table for divide-by-1/2/3 circuit 900 is shown. Truth table 970 includes four columns, with three columns for the following three control signals: Div1, P, and $mod_{in}$. The fourth column of truth table 970 shows the divisor value by which the input frequency to circuit 900 will be divided to generate the output frequency, with the divisor value set by the three control signals. When Div1 is '0', the control signals P and $mod_{in}$ select a divisor value of two or three. When Div1 is '1', the divisor has a value of one.

Figure 10:
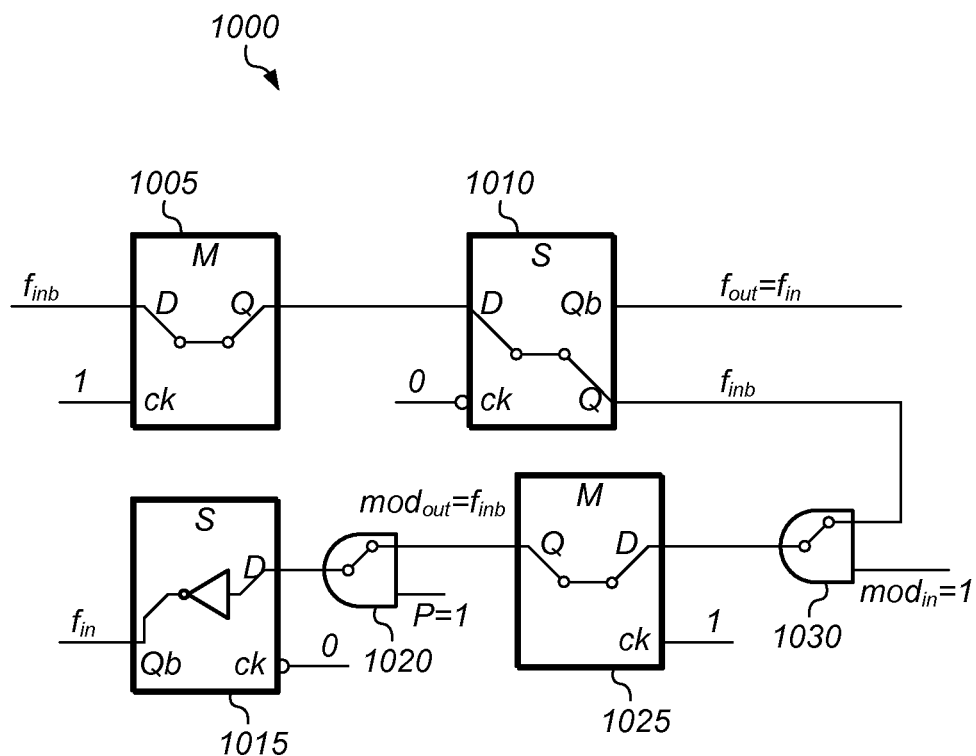
FIG. 10 illustrates one embodiment of a circuit diagram of a divide-by-1/2/3 circuit set to divide-by-1 mode.

Turning now to FIG. 10, one embodiment of a circuit diagram of a divide-by-1/2/3 circuit set to divide-by-1 mode is shown. Circuit 1000 generates an output frequency (fout) at the same frequency as the input frequency (fin). Circuit 1000 is an equivalent circuit to circuit 900, and some of the circuit elements (multiplexers, inverter, AND gate) are not shown for the purpose of simplicity. In the example shown in FIG. 10, the input control signals to circuit 1000 are the following: Div1 is '1', P is '1', and $mod_{in}$ is '1'. To set circuit 1000 into divide-by-1 mode, only control signal Div1 is required to be '1'. P and $mod_{in}$ are set to '1' for ease of illustration. However, both signals may also be set to '0' and circuit 1000 will also remain in divide-by-1 mode.

Figures 5A, 5B:
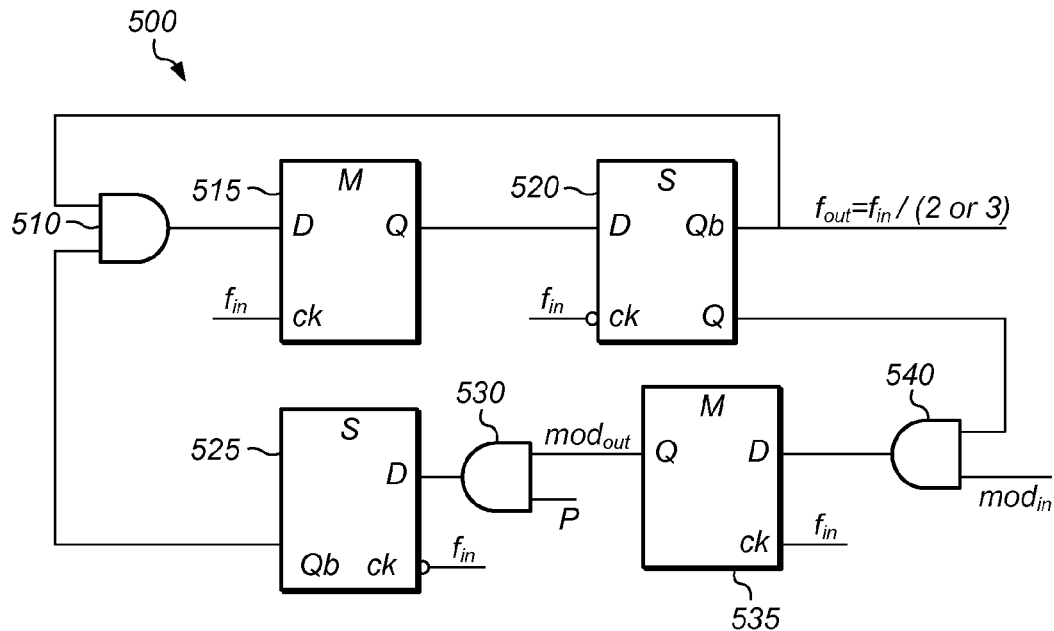
FIG. 5A illustrates a circuit diagram of a prior art divide-by-2/3 cell.
FIG. 5B illustrates a truth table for a divide-by-2/3 cell.
Figure 6A:
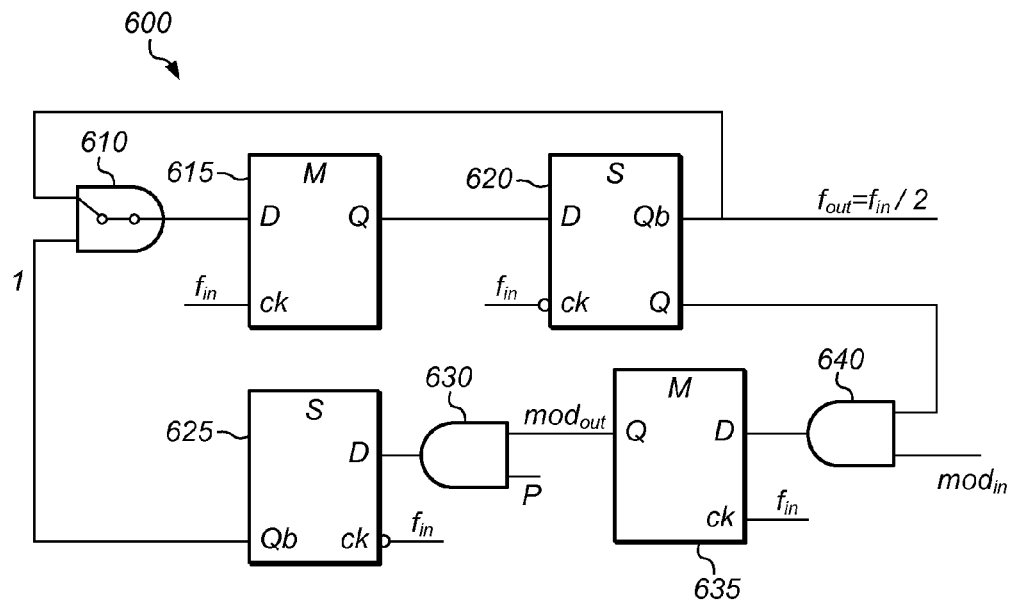
FIG. 6A illustrates a circuit diagram of a prior art divide-by-2/3 cell set to divide-by-2 mode.
Figure 6B:
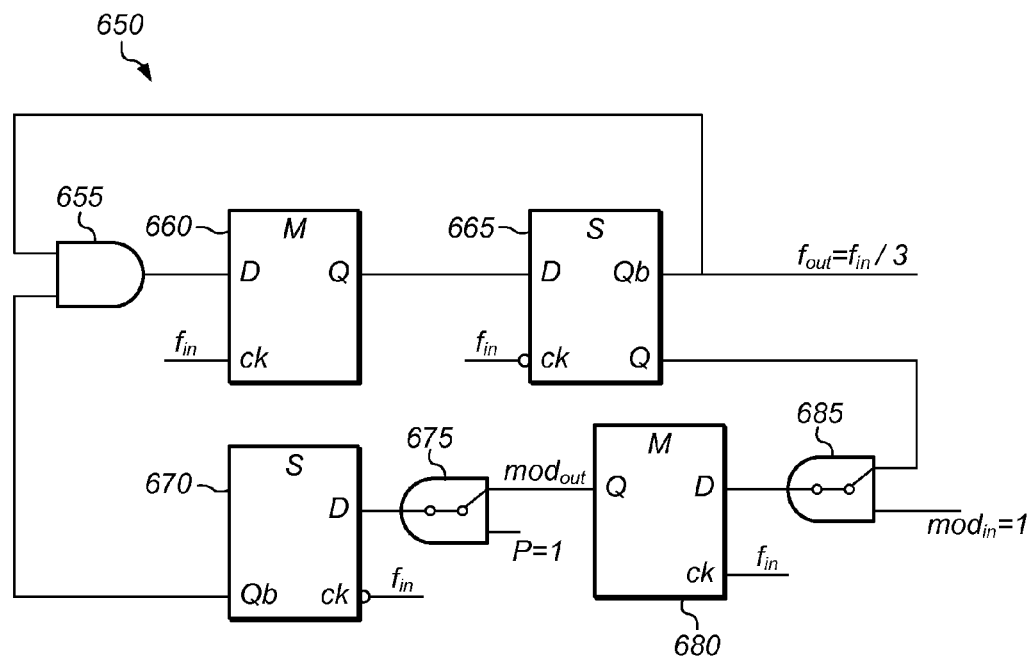
FIG. 6B illustrates a circuit diagram of a prior art divide-by-2/3 cell set to divide-by-3 mode.
Figures 11A, 11B:
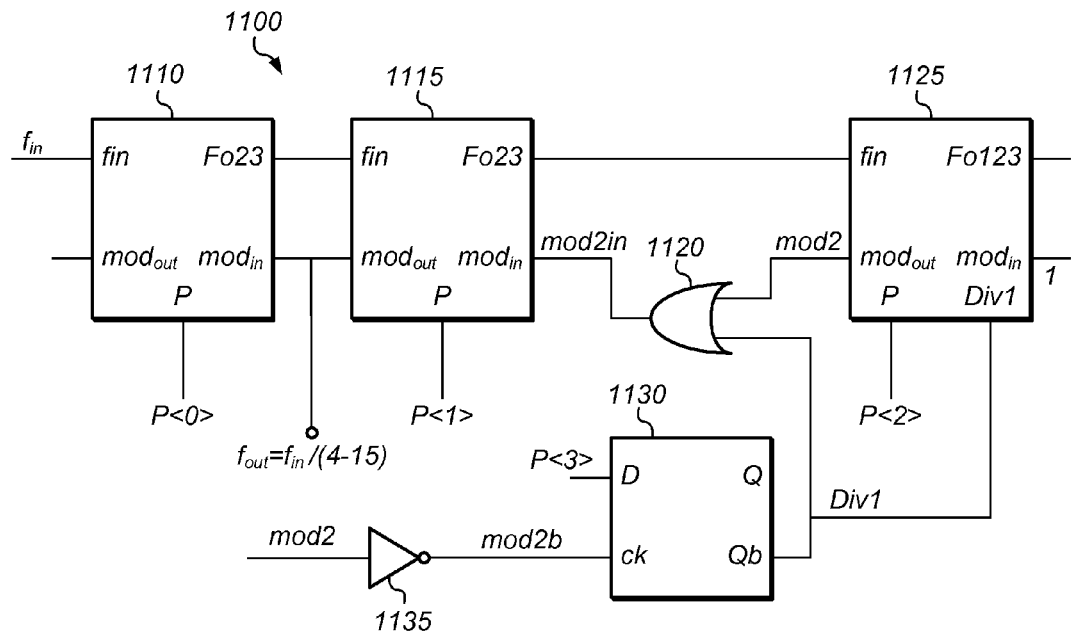
FIG. 11A illustrates one embodiment of a schematic diagram of a frequency divider circuit with a divide range of 4-to-15.
FIG. 11B illustrates a truth table for a divider with divisor range 4-to-15.

Referring now to FIG. 11A, one embodiment of a schematic diagram of a divider circuit with a divide range of 4-to-15 is shown. Unlike the circuits of Vaucher (FIG. 7A) and Neurauter et al (FIG. 8), circuit 1100 may not suffer from a discontinuity (i.e., incorrect value of a divisor) when transitioning across a $2^n-1$ to $2^n$ boundary. Circuit 1100 includes divide-by-2/3 cells 1110 and 1115 and divide-by-1/2/3 cell 1125. These three cells are arranged in a series with signals coupled between consecutive elements. Divide-by-2/3 cells 1110 and 1115 may be implemented using circuit 500 of FIG. 5A. It is noted that circuit 500 is only one possible embodiment of a divide-by-2/3 cell which may be used, and other types of divide-by-2/3 cells may also be used with the approaches and mechanisms described herein. For example, alternative divide-by-2/3 cells may use flip-flops instead of latches. Other types and configurations of divide-by-2/3 cells are also possible. Divide-by-1/2/3 cell 1125 may be implemented using circuit 900 of FIG. 9A. Alternatively, divide-by-1/2/3 cell 1125 may be implemented using different circuit elements, structures, or configurations than those of circuit 900.

Circuit 1100 also includes two-input OR gate 1120, latch 1130, and inverter 1135. In another embodiment, an active low latch may be substituted for latch 1130 and inverter 1135. In a further embodiment, circuit elements 1120, 1130, and 1135 may be replaced individually or collectively with other functionally equivalent circuit elements. For example, two-input OR gate 1120 may be replaced by a two-input NAND gate with inverters coupled to each of the two inputs. Type latch 1130 may be replaced by one or more latches, registers, and/or flip-flops. Other structures of circuit elements may be arranged that are the functional equivalent of circuit 1100.

The first circuit element in the cascaded series of dividers of circuit 1100 is divide-by-2/3 cell 1110. The frequency input to cell 1110 is the input frequency ($f_{in}$) to circuit 1100; $f_{in}$ is the frequency being divided by circuit 1100. The frequency output port (Fo23) of cell 1110 is coupled to the frequency input port (fin) of divide-by-2/3 cell 1115. Also, the $mod_{in}$ port of cell 1110 is coupled to the $mod_{out}$ port of cell 1115. The frequency output port ($f_{out}$) of circuit 1100 is tapped off of the $mod_{in}$ port of cell 1110. The frequency output port (Fo23) of cell 1115 is coupled to the frequency input port (fin) of divide-by-1/2/3 cell 1125. The $mod_{in}$ port of cell 1115 is coupled to the output port of OR gate 1120. The $mod_{in}$ port of cell 1115 is also labeled with the signal name "mod2in" in FIG. 11A.

The frequency output port (Fo123) of cell 1125 and the $mod_{out}$ port of cell 1110 are left unconnected or floating. Cell 1110 is the first cell in the series of cells in circuit 1100, and therefore, the $mod_{out}$ port of cell 1110 may be unconnected. Cell 1125 is the last cell in the series of cells in circuit 1100, and therefore, the frequency output port (Fo123) of cell 1125 may be unconnected. The $mod_{in}$ port of cell 1125 is coupled to logic '1'. The DIV1 port of cell 1125 is coupled to the Qb output port of latch 1130. The $mod_{out}$ port of cell 1125 (also labeled with the signal name "mod2") is coupled to one of the input ports of OR gate 1120 and to the input port of inverter 1135. The output port of inverter 1135 (mod2b) is coupled to the ck port of latch 1130. The ck port of latch 1130 may also be referred to as the clock, enable, or clock enable port.

Latch 1130 includes four ports. The Q port is left unconnected or floating. The Qb output port is connected to the DIV1 port of cell 1125. The Qb output port is also connected to one of the inputs of the two-input OR gate 1120. The clock port on latch 1130 is connected to the output of inverter 1135. The input to inverter 1135 is connected to the $mod_{out}$ port of the cell 1125.

The four control signals P0, P1, P2, and P3, are the signals of the programming divisor word that select the value of the divisor. The signals P0-P3 may be generated from a control or decoder circuit (not shown). The divisor may be any integer value between four and fifteen, and the divisor may change on each $f_{out}$ cycle. P0 connects to the P port of cell 1110, P1 connects to the P port of cell 1115, P2 connects to the P port of the cell 1125, and P3 connects to the D port of latch 1130.

Circuit 1100 of FIG. 11a may be expanded to create other clock dividing circuits with different divisor ranges. More 2/3 and 1/2/3 divider cells may be added to the series of cells to create different ranges of possible divisors. Also, a two-input OR gate, latch, and inverter may be added for each 1/2/3 divider cell added to the series. The effective range of possible divisor values 'N' may be determined by the formula $2^j \le N \le 2^{(i+1)}-1$, where 'j' represents the number of divide-by-2/3 cells and 'i' represents the total number of divide-by-2/3 cells and divide-by-1/2/3 cells. As compared to the prior art of FIG. 8, circuit 1100 achieves the same range of divisor values (4-to-15) with one less divide-by-1/2/3 cell.

The circuit elements of circuit 1100 may be implemented using any of a variety of types of logic gates, including transistor-transistor logic (TTL), complementary metal-oxide-semiconductor (CMOS), emitter-coupled logic (ECL), positive emitter-coupled logic (PECL), current-mode logic (CML), and others. The signals passing between circuit elements may be implemented as single-ended signals or differential signals.

Circuit 1100 may be utilized as a prescaler or as a multi-modulus divider (MMD). Circuit 1100 may also be utilized in a frequency synthesizer, fractional-N frequency synthesizer, phase locked loop (PLL), receiver, transmitter, or transceiver. In addition, circuit 1100 may also be utilized as part of a radio (e.g., multi-standard radio, multi-mode radio, cognitive radio, software defined radio (SDR)). Other utilizations of circuit 1100 are possible and are contemplated.

Circuit 1100 may be implemented in a variety of ways. In one embodiment, circuit 1100 may be built out of discrete circuit elements or integrated circuit (IC) chips soldered onto a printed circuit board. In another embodiment, circuit 1100 may be designed using a hardware description language (HDL) (e.g., very high speed integrated circuit hardware description language (VHDL), Verilog). The HDL design may be implemented in a programmable logic device (PLD) (e.g., field programmable gate array (FPGA), complex programmable logic device (CPLD)). In a further embodiment, circuit 1100 may be implemented in an application-specific integrated circuit (ASIC). Circuit 1100 may be designed initially in a HDL. Then, the design may be compiled and synthesized into a format (e.g., netlist) suitable for the fabrication of an ASIC. The ASIC may also contain other circuits that perform other functions in addition to the circuit 1100. In another embodiment, circuit 1100 may be designed or drawn in a schematic form and converted (i.e., compiled and synthesized) into a form suitable to be used as an input to a PLD or ASIC. For example, circuit 1100 may be designed or drawn in a schematic form and converted into a HDL format. Then the HDL format may be compiled and synthesized into a format (e.g., netlist) used to program a PLD or fabricate an ASIC.

The circuit of FIG. 11A may not suffer any discontinuities from small steps across an octave boundary, such as a step from a divisor of seven to a divisor of eight. However, on large steps across an octave boundary, such as a step from a divisor of seven to a divisor of twelve, a discontinuity may occur for the circuit of FIG. 11A. In general, discontinuities may occur when transitioning with a large hop across an octave boundary, such that the hop transitions from a divisor of less than $2^n$ to a divisor of $(1.5*2^n)$ or greater, where n is a positive integer. In FIG. 11A, the discontinuity may occur when divide-by-1/2/3 cell 1125 transitions from a divisor of one to a divisor of three.

Referring now to FIG. 11B, a truth table for circuit 1100 is shown. Truth table 1150 contains one column for the divisor value, and the divisor value is any integer value between 4 and 15. There is a row in the truth table for each of the divisors ranging from 4 to 15. For each of the divisor values listed in the truth table, the P0-P3 values are listed. The P0-P3 values are the values which control the divisor value. An external circuit may control the P0-P3 values in order to control the divisor value and the output frequency. The signals used to control the P0-P3 values may be referred to as a programming word.

There is a column in truth table 1150 for the signal mod2in, which is the signal coupled to the $mod_{in}$ port of cell 1115. The signal mod2in is also connected to the output node of OR gate 1120. The column for mod2in shows the value of this signal for the different P0-P3 values. The value of mod2in is '1' for a P3 value of '0'. When P3 has a value of '1', then mod2in has a value equal to the signal mod2. The signal mod2 is connected to the $mod_{out}$ port of cell 1125. The Div1 column shows the value of the signal Div1, which is the inverse of signal P3. The 'Stage3 Divisor' column shows the divisor used in cell 1125 to divide the frequency input coupled to the fin port.

Figure 12:
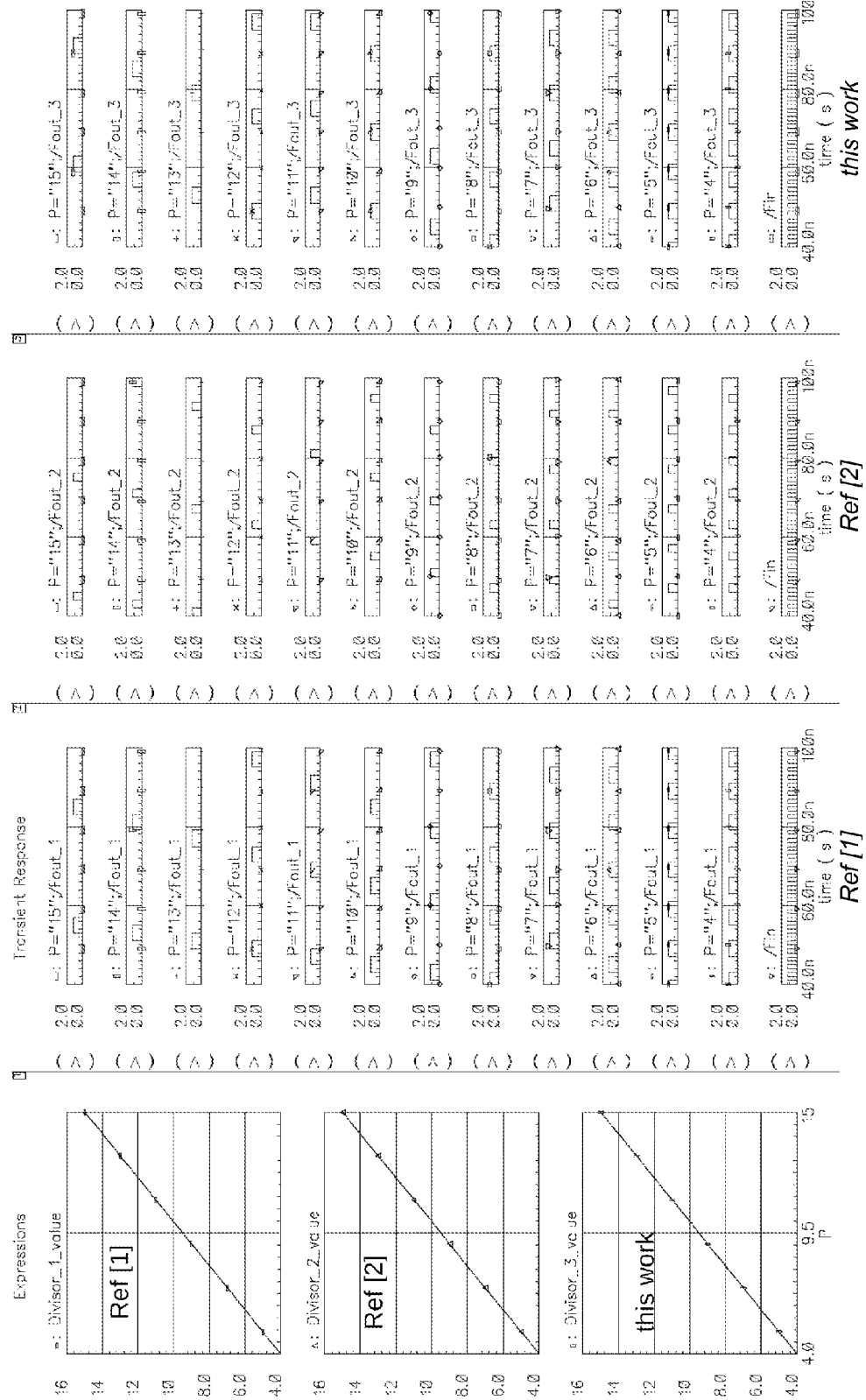
FIG. 12 illustrates a static simulation of three different frequency dividers over a divisor range of 4-to-15.

Turning now to FIG. 12, static simulation results for three different frequency dividers with divisor values swept from P=4 to P=15 are shown. "Ref [1]" refers to the divider circuit described by Vaucher and shown in FIG. 7A. "Ref [2]" refers to the divider circuit described by Neurauter et al. and shown in FIG. 8. The figure labeled "this work" refers to the divider circuit 1100 shown in FIG. 11A. All three dividers divide by 4-15 correctly in static cases, as can be seen by the plots of divisor value versus P.

Figure 13:
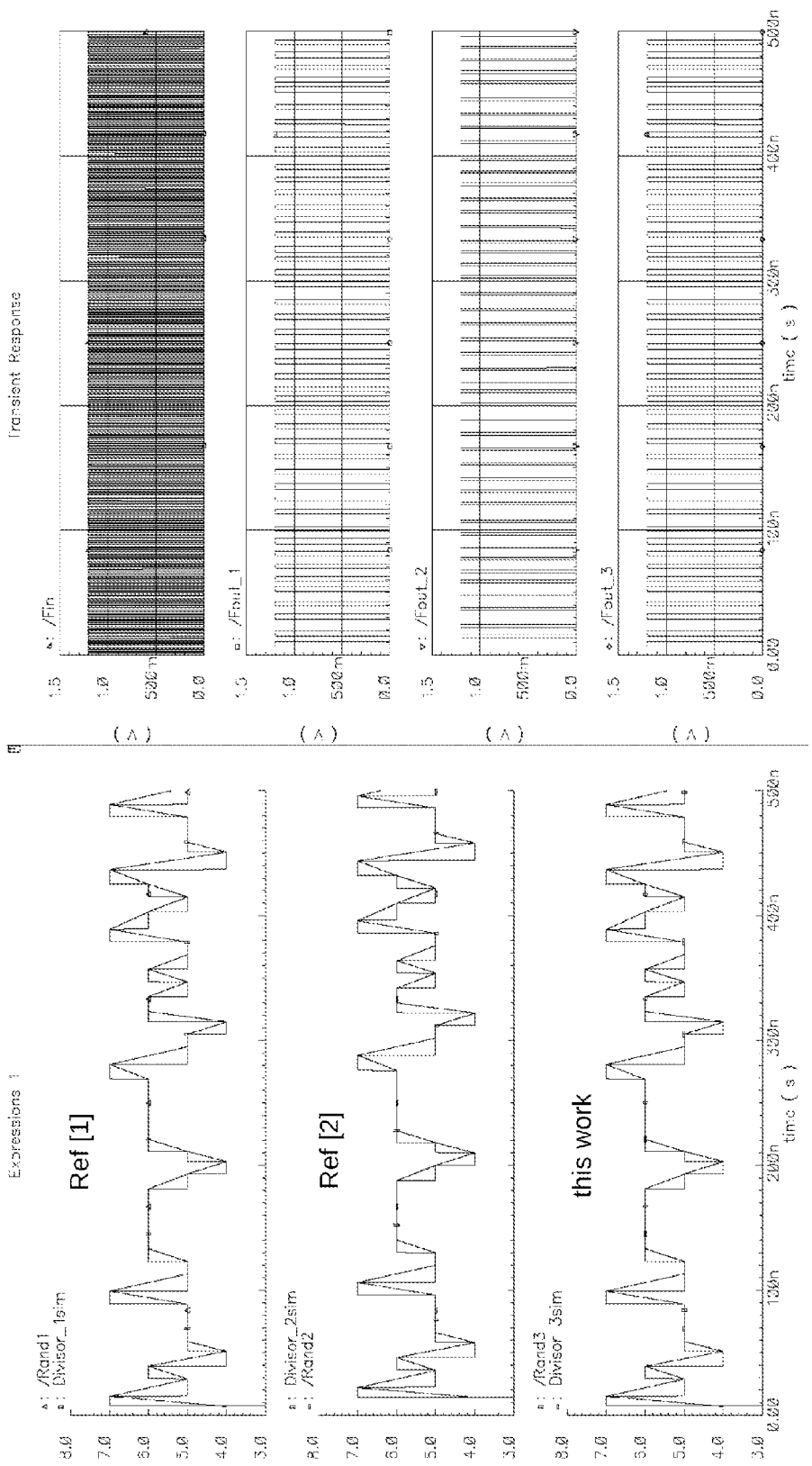
FIG. 13 illustrates a simulation of three different frequency dividers with a divisor randomly hopping over a range of 4-to-7.
Figure 14:
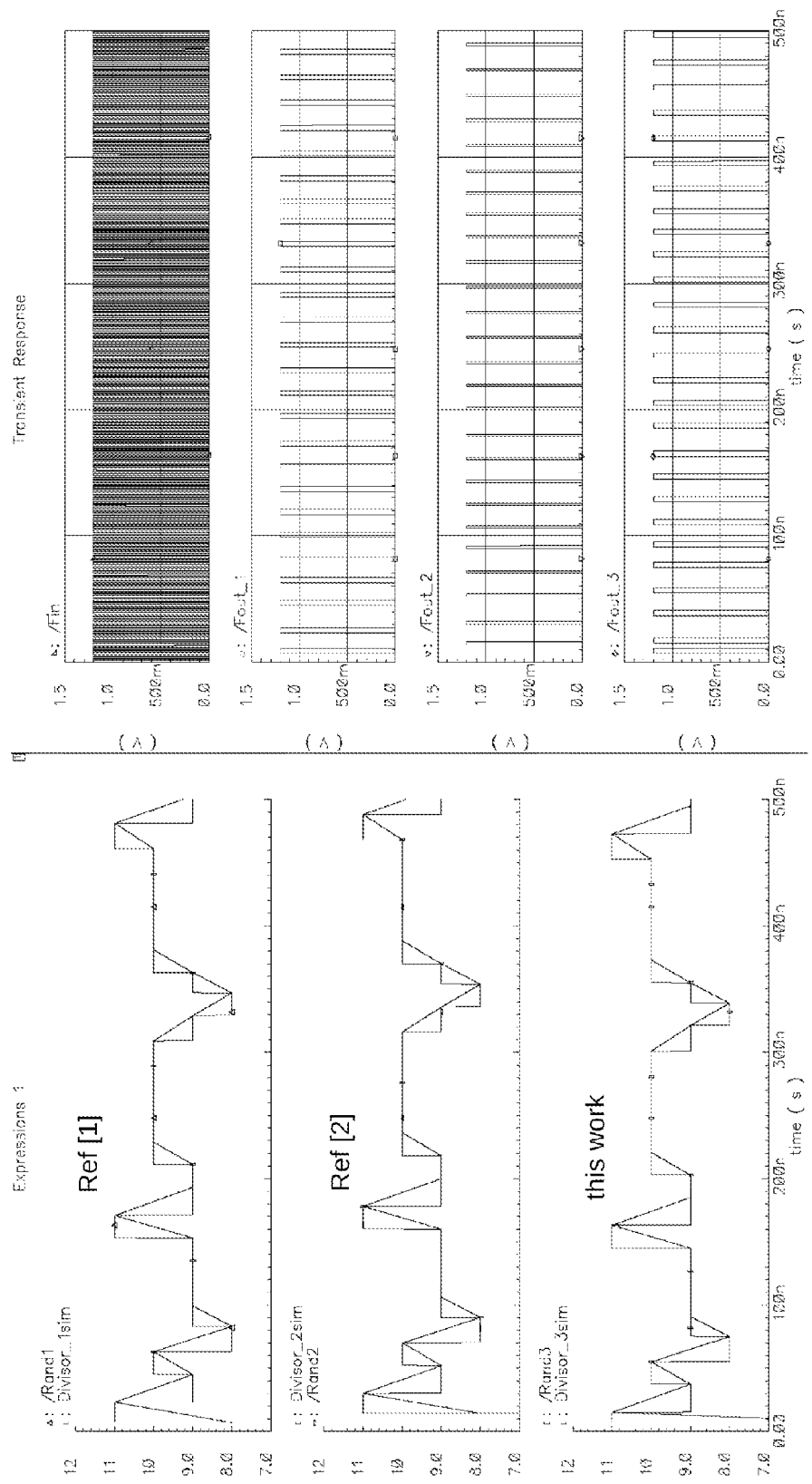
FIG. 14 illustrates a simulation of three different frequency dividers with a divisor randomly hopping over a range of 8-to-11.

Referring now to FIG. 13, a simulation of three different frequency dividers with a divisor randomly hopping over a range of 4-to-7 is shown. The simulation shows results from the same three dividers shown in FIG. 12. However, in FIG. 13, the divisor values are changed randomly over a range of 4-to-7. FIG. 14 is similar to FIG. 13, except the divisor value is changed randomly over a range of 8-to-11. The input frequency is constant and the output frequency and divisor are calculated once a cycle. In between cycles the programmed random divisor value is constant, which is why the programmed divisor value looks like a stairstep response and the simulated divisor value has sharp vertices. For both FIGS. 13 and 14, the calculated divisor values track the programmed divisor values. Thus, all three dividers work correctly for the cases shown in FIGS. 12-14.

Figure 15:
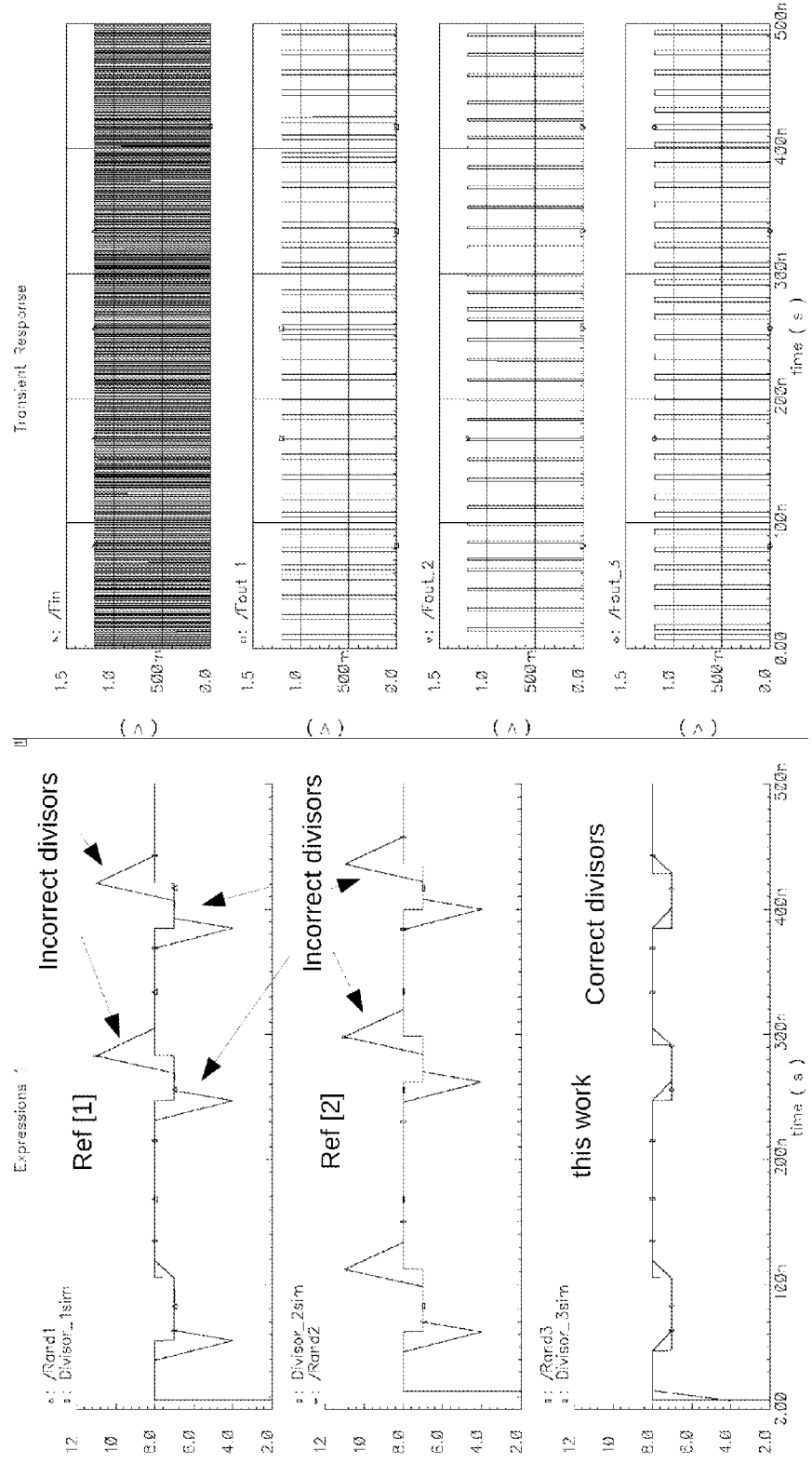
FIG. 15 illustrates a simulation of three different frequency dividers with a divisor randomly hopping over a range of 7-to-8.

However, for FIG. 15, the divisor values are randomly varied between 7 and 8, which is a $(2^n-1)$ to $2^n$ octave boundary region. For this condition, it can be seen that only the third divider (circuit 1100 of FIG. 11A) tracks the input programming. The first two dividers (Ref [1] and Ref [2]) miss one cycle during each octave boundary transition, while divider circuit 1100 does not miss any cycles.

Figures 7A, 7B:
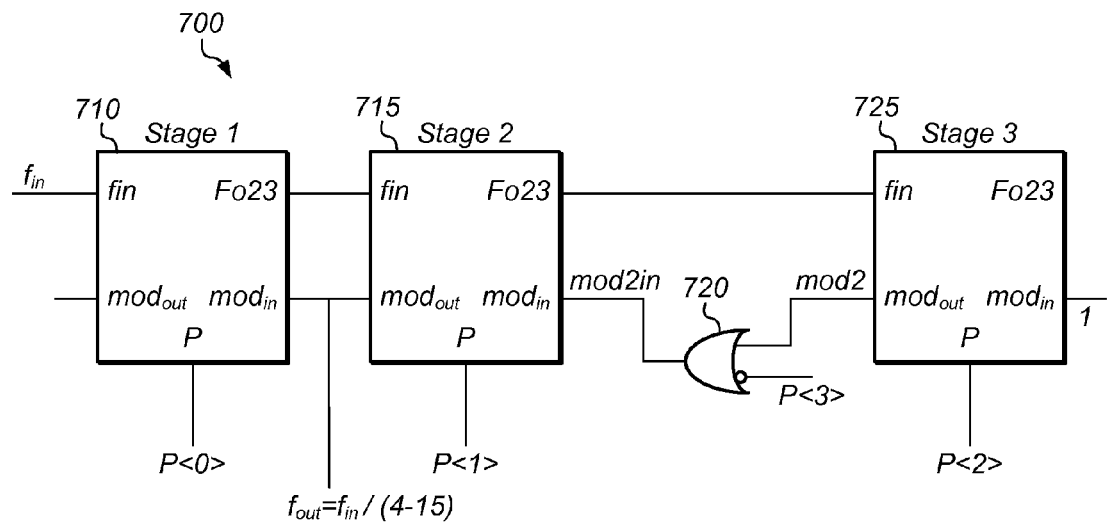
FIG. 7A illustrates a schematic diagram of a prior art divider with range 4-to-15.
FIG. 7B illustrates a truth table for a divider with range 4-to-15.
Figure 8:
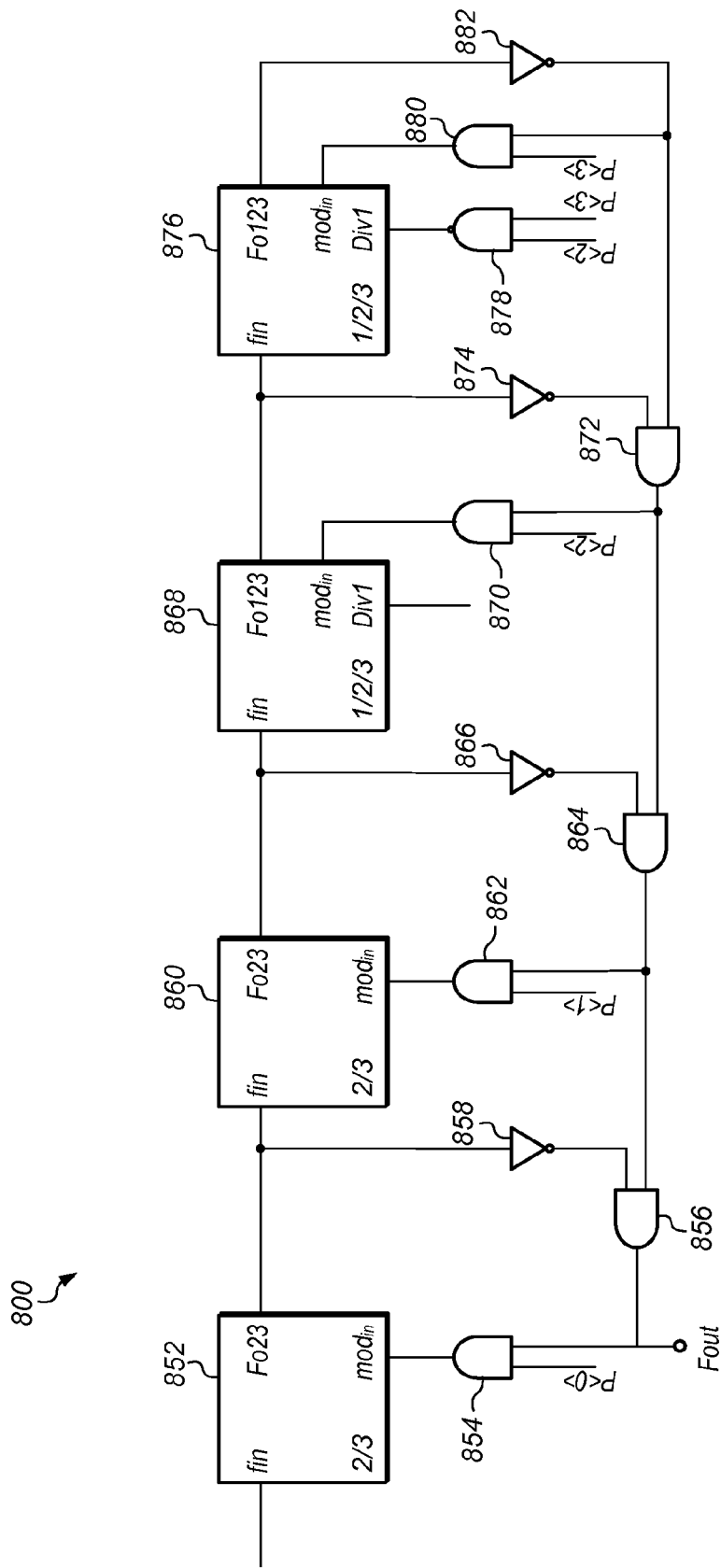
FIG. 8 illustrates a schematic diagram of a prior art divider chain with an extended division range.

At least one improvement of circuit 1100 of FIG. 11A over circuit 700 of FIG. 7A comprises recognizing the asynchronous nature of the unused 2/3 cells in "extended division range" mode and forcing them into an alternate synchronous mode instead. This entails creating a divide-by-1 mode which passes the input clock in the unused latches, as opposed to having the latches in divide-by-3 mode and creating an asynchronous signal state. Thus the new architecture of circuit 1100 has modified divide-by-1/2/3 cell 1125 at the end of the cascade to accomplish this, and a control bit (P3) to tell the last stage to enter the divide-by-1 or clock-bypass mode.

Figure 16:
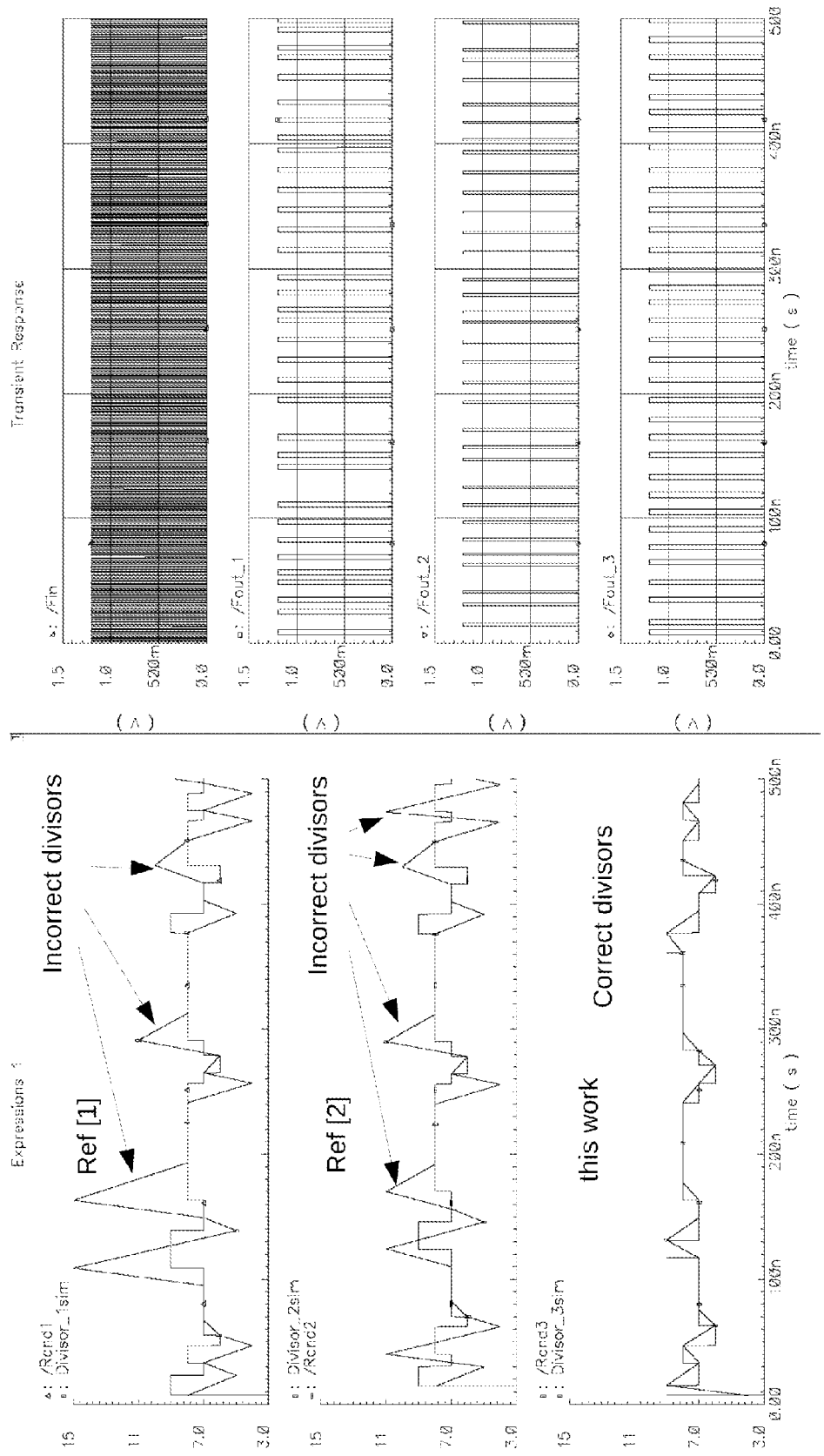
FIG. 16 illustrates a simulation of three different frequency dividers with a divisor randomly hopping over a range of 6-to-9.
Figure 17:
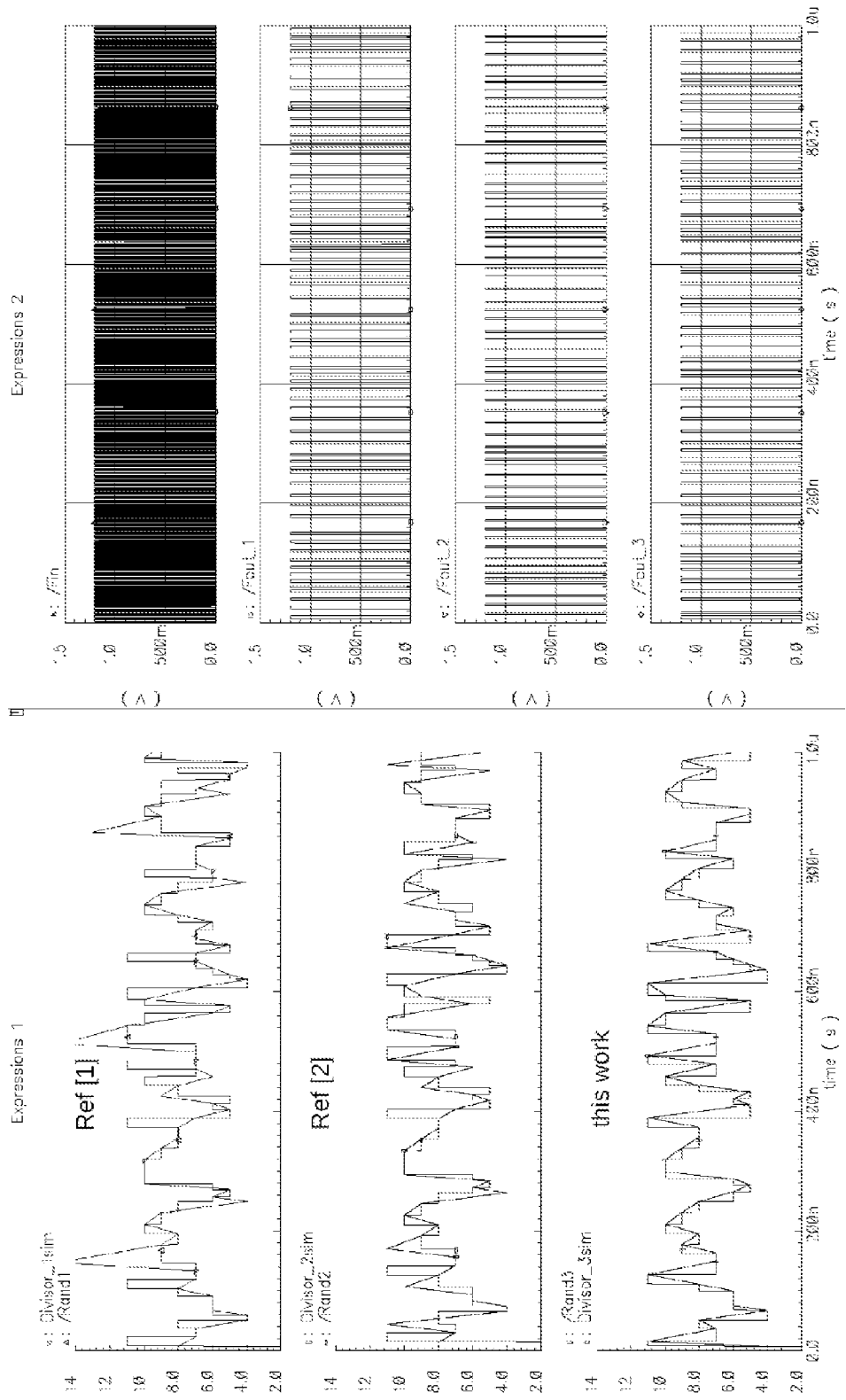
FIG. 17 illustrates a simulation of three different frequency dividers with a divisor randomly hopping over a range of 4-to-11.

FIG. 16 and FIG. 17 show similar sweeps of the three dividers for programming divisor values of 6-9 and 4-11, respectively. These divisor values of 6-9 and 4-11 pass over the octave boundary of 7-to-8. As can be seen from FIG. 16 and FIG. 17, only divider circuit 1100 of FIG. 11A (this work) functions correctly, while the circuits of Ref [1] (FIG. 7A) and Ref [2] (FIG. 8) divide by an incorrect value during a transition over the octave boundary of 7-to-8.

Figure 18:
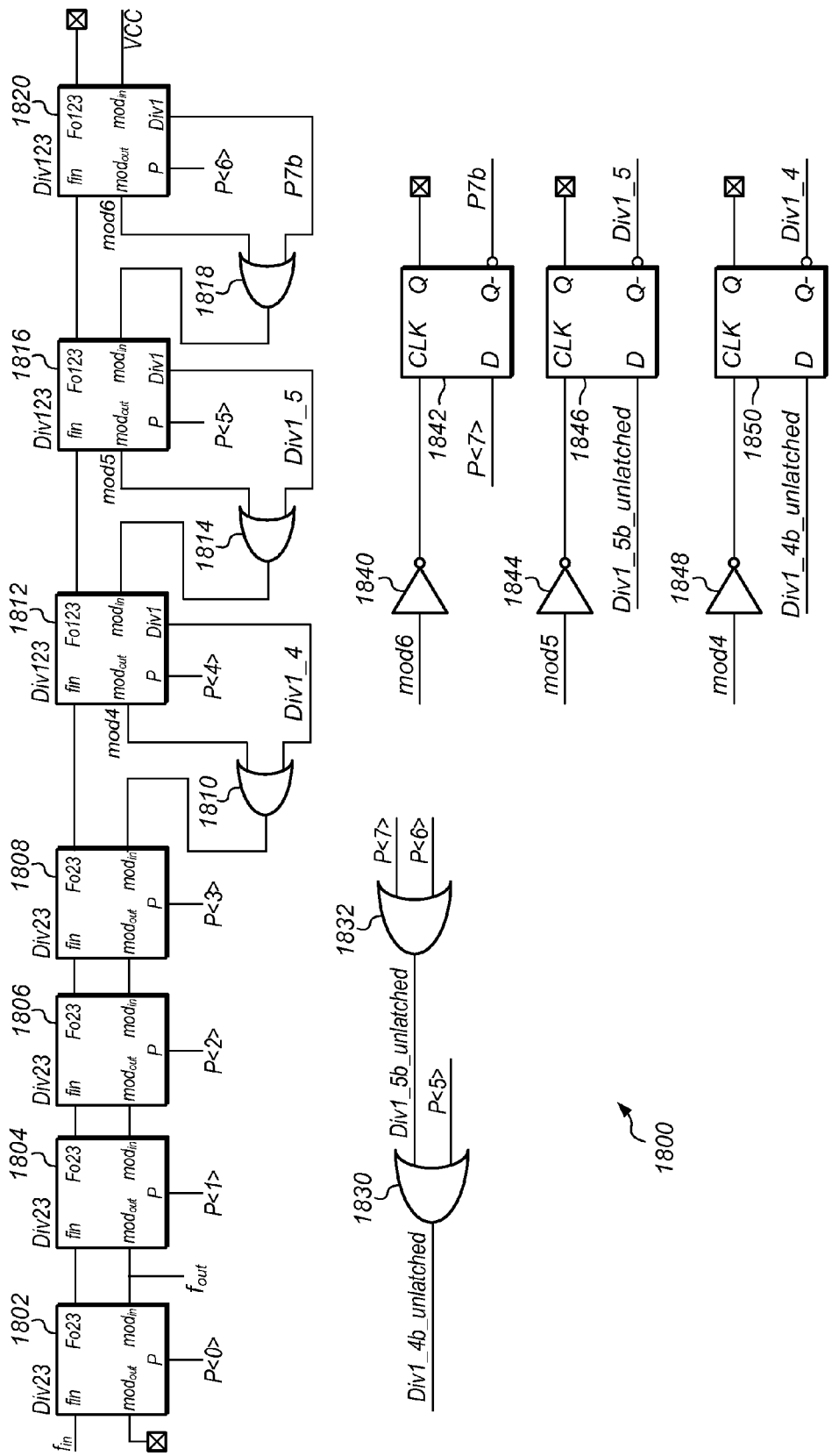
FIG. 18 illustrates one embodiment of a schematic diagram of a frequency divider with a divisor range of 16-to-255.

Referring now to FIG. 18, one embodiment of a schematic diagram of a frequency divider with a divisor range of 16-to-255 is shown. FIG. 18 utilizes the same design technique utilized in circuit 1100 (of FIG. 11A) but extended to a divider with a divisor range of 16-to-255. In general, the same technique can be applied to various multi-octave divider ranges of interest.

Divider circuit 1800 includes a series of four divide-by-2/3 cells (1802, 1804, 1806, and 1808) and three divide-by-1/2/3 cells (1812, 1816, and 1820). The effective range of possible divisor values 'N' may be determined by the formula $2^j \leq N \leq 2^{(i+1)}-1$, where 'j' represents the number of divide-by-2/3 cells and 'i' represents the total number of divide-by-2/3 cells and divide-by-1/2/3 cells. For circuit 1800, 'j' is four and 'i' is seven, so the effective range of possible divisor values is 16-to-255.

Since divider circuit 1800 includes more than one divide-by-1/2/3 cell in the series of divider cells, circuit 1800 includes an additional series of two-input OR gates (1832 and 1830). The two highest P control signals (P7 and P6), corresponding to the two MSB's of the programming divisor word, may be coupled to the input nodes of the first two-input OR gate (1832) of the series. The output of OR gate 1832 may be coupled to an input node of the second two-input OR gate (1830) and to the D node of latch 1846; latch 1846 corresponds to the next to last divide-by-1/2/3 cell (1816) in the series of cells. The next or third MSB of the P control signals (P5) may be coupled to the other input node of the second OR gate 1830. The output node of OR gate 1830 may be coupled to the D node of latch 1850; latch 1850 corresponds to cell 1812. In other embodiments, the arrangement of the additional series of two-input OR gates and coupling of corresponding signals may continue in a like fashion for the plurality of divide-by-1/2/3 cells and associated circuit elements.

For each divide-by-1/2/3 cell in the series of cells, a latch, inverter gate, and two-input OR gate may be included in the frequency divider circuit. The Div1 node of each divide-by-1/2/3 cell may be coupled to a first input node of the two-input OR gate and to a Qb node of the latch. The $mod_{out}$ port of each divide-by-1/2/3 cell may be coupled to a second input node of the two-input OR gate and to an input node of the inverter gate. The output node of the inverter gate may be coupled to a clock port of the latch. The P control signal may be coupled to a D node of the corresponding latch if the series of cells includes only a single divide-by-1/2/3 cell. Alternatively, for a series of cells including a plurality of divide-by-1/2/3 cells, the signal coupled to the D node may come from the corresponding signal from the additional series of OR gates described above. The $mod_{in}$ port of each divide-by-1/2/3 cell may be coupled to an output node of the two-input OR gate corresponding to a subsequent divide-by-1/2/3 cell. For the last divide-by-1/2/3 cell in the series of cells, the mod port may be coupled to a high logic level (logic '1').

Figure 19:
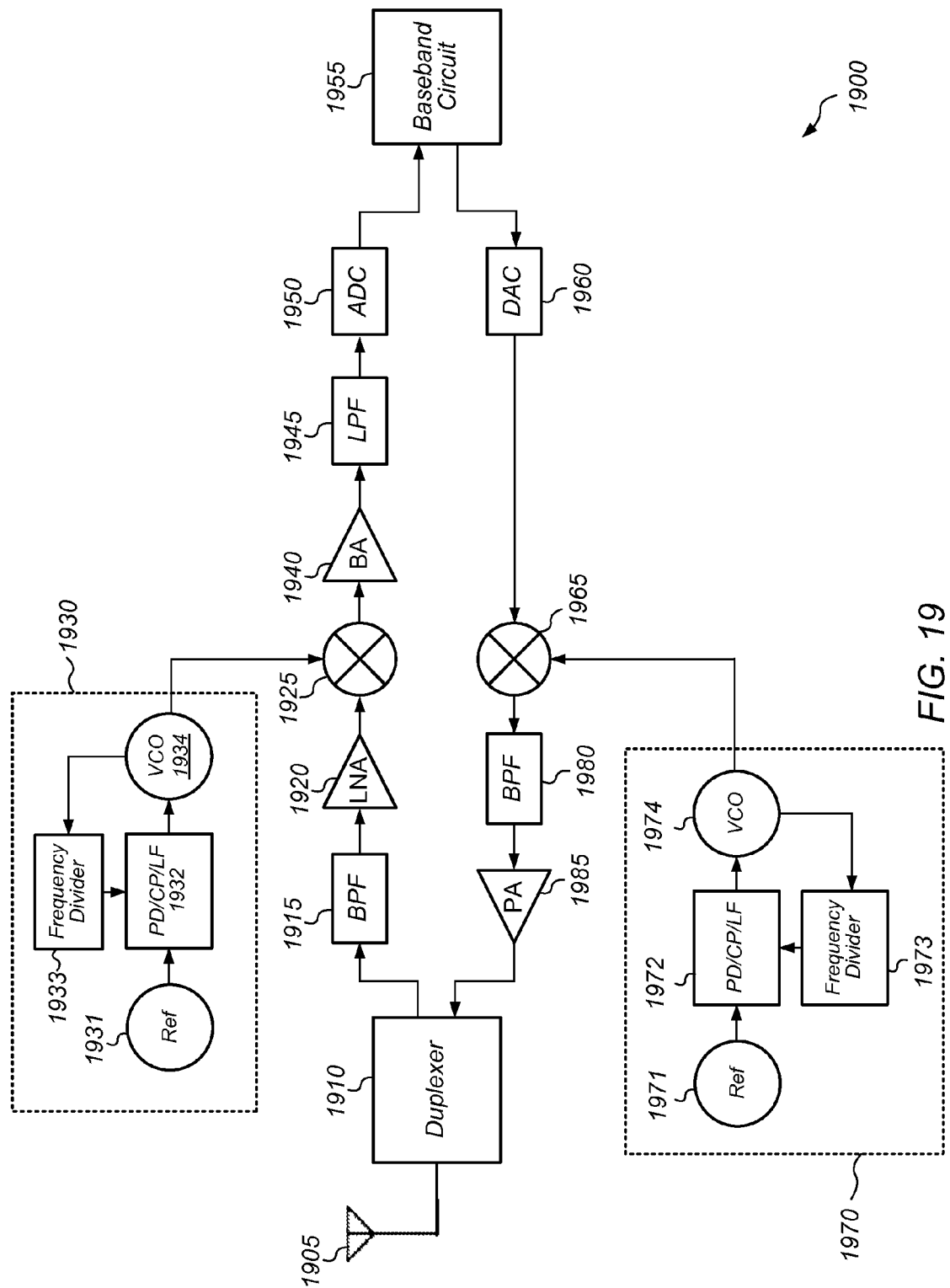
FIG. 19 illustrates a block diagram of a radio utilizing frequency dividers with synchronous range extension.

Turning now to FIG. 19, a block diagram illustrating a radio 1900 as an example of an application utilizing frequency dividers with synchronous range extension is shown. Radio 1900 includes antenna 1905 for transmitting and receiving signals. Duplexer 1910 is coupled to antenna 1905, and duplexer 1910 is coupled to band-pass filter (BPF) 1915 on the receive path. Duplexer 1910 is also coupled to power amplifier (PA) 1985 on the transmit path of radio 1900. BPF 1915 is coupled to low-noise amplifier (LNA) 1920 on the receive path, and then LNA 1920 is coupled to demodulator 1925. Demodulator 1925 may be a quadrature demodulator or other type of demodulator. PLL 1930 may be employed as a local oscillator for demodulator 1925. PLL 1930 may include a crystal reference oscillator 1931, phase detector/charge pump/loop filter (PD/CP/LF) 1932, frequency divider 1933, and VCO 1934. Frequency divider 1933 may be a frequency divider with synchronous range extension, such as divider 1800 (of FIG. 18) or divider 1100 (of FIG. 11A).

Demodulator 1925 is coupled to baseband amplifier (BA) 1940, and (BA) 1940 is coupled to low-pass filter (LPF) 1945. LPF 1945 is coupled to analog-to-digital converter (ADC) 1950, and then ADC 1950 is coupled to baseband circuit 1955. Baseband circuit 1955 may receive and process the digital data received from ADC 1950 on the receive path. On the transmit path, baseband circuit may generate digital data for transmission by radio 1900, and then convey the digital data to digital-to-analog converter (DAC) 1960. DAC 1960 is coupled to modulator 1965, and modulator 1965 may be a quadrature modulator or other type of modulator.

PLL 1970 may be employed as a local oscillator for modulator 1965. PLL 1970 may include a crystal reference oscillator 1971, PD/CP/LF 1972, frequency divider 1973, and VCO 1974. Frequency divider 1973 may be a frequency divider with synchronous range extension, such as divider 1800 or divider 1100. The output of modulator 1965 is coupled to BPF 1980, and BPF 1980 is coupled to PA 1985. PA 1985 is coupled to duplexer 1910, and then duplexer 1910 may convey the transmit signal to antenna 1905.

Radio 1900 depicts one embodiment of a radio or transceiver which may utilize a frequency divider as described in this specification. Other embodiments of radios may include other components not shown in FIG. 19 and/or omit certain of the components shown in FIG. 19. Radio 1900 and frequency dividers 1933 and 1973 may be utilized in many types of radio applications, such as a multi-standard or multi-mode radio, a cognitive radio, or a software defined radio (SDR). The frequency dividers described in this specification may also be employed in frequency synthesizers or PLL's within many different types of products or applications, including cell phones, cordless phones, radar, electronic warfare systems, television, computers, cable modems, cable set-top boxes, and others.

Figure 20:
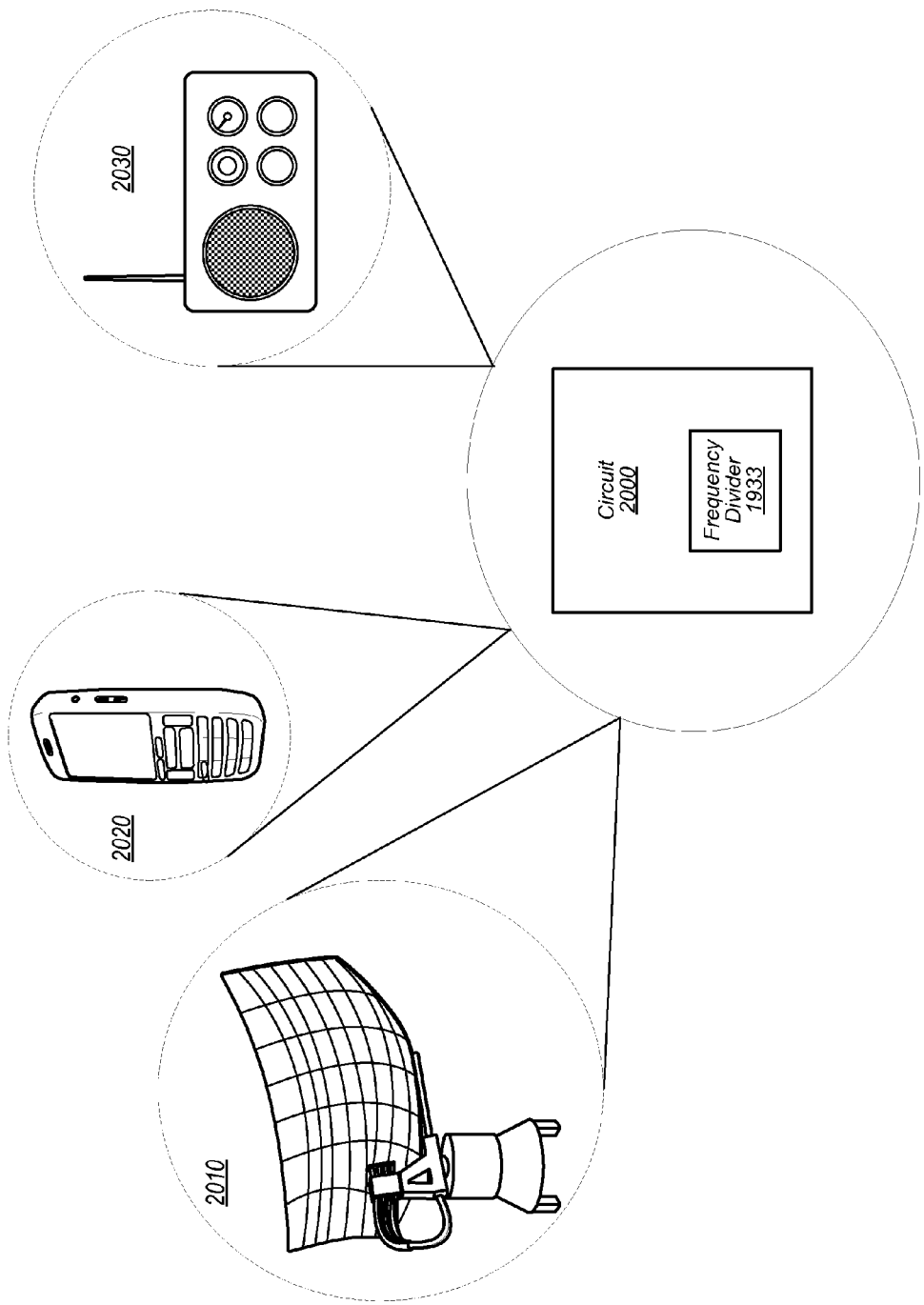
FIG. 20 illustrates a block diagram of one embodiment of a circuit.

Referring now to FIG. 20, a block diagram of one embodiment of a circuit 2000 is shown. As shown, circuit 2000 may be incorporated in a radar 2010, cell phone 2020, radio 2030, or in various other devices or systems. Radio 2030 may be a multi-standard or multi-mode radio, cognitive radio, software defined radio (SDR), or other type of radio. In the illustrated embodiment, the circuit 2000 includes at least one instance of frequency divider 1933. In various embodiments, circuit 2000 may include functionality for any of various devices, such as fractional-N synthesizers, prescalers, multi-modulus dividers, PLLs, receivers, transmitters, transceivers, and other devices. Also, in various embodiments, circuit 2000 may include one or more of the components of radio 1900 shown in FIG. 19.

Although the embodiments above have been described in considerable detail, numerous variations and modifications will become apparent to those skilled in the art once the above disclosure is fully appreciated. It should also be emphasized that the above-described embodiments are only non-limiting examples of implementations. It is intended that the following claims be interpreted to embrace all such variations and modifications.

What is claimed is:

1. A frequency divider comprising a series of one or more divide-by-2/3 cells and one or more divide-by-1/2/3 cells, wherein the frequency divider is configured to correctly divide an input frequency by a divisor on successive output cycles, responsive to the divisor transitioning across an octave boundary on the successive output cycles, and wherein a last divide-by-1/2/3 cell of the series is configured to utilize a synchronous divide-by-1 mode responsive to the divisor transitioning across the octave boundary, wherein synchronous divide-by-1 mode entails passing an input clock through a D node of a first latch of the last divide-by-1/2/3 cell.

2. The frequency divider as recited in claim 1, wherein the frequency divider is configured to use extended division range spanning more than one octave.

3. The frequency divider as recited in claim 1, wherein the divisor is transitioning from a first positive integer to a second positive integer across the octave boundary.

4. The frequency divider as recited in claim 3, wherein transitioning across the octave boundary comprises transitioning from a divisor equal to $2^N-1$ to a divisor equal to $2^N$, or transitioning from a divisor equal to $2^N$ to a divisor equal to $2^N-1$, wherein N is a positive integer.

5. The frequency divider as recited in claim 1, wherein the one or more divide-by-1/2/3 cells are at an end of the series.

6. The frequency divider as recited in claim 1, wherein synchronous divide-by-1 mode further entails coupling the input clock through an inverter and a multiplexer to a D node of the first latch of the last divide-by-1/2/3 cell.

7. The frequency divider as recited in claim 6, wherein synchronous divide-by-1 mode further entails connecting a logic '1' to a clock node of the first latch of the last divide-by-1/2/3 cell.

8. A frequency divider comprising a series of one or more divide-by-2/3 cells and one or more divide-by-1/2/3 cells using extended division range, wherein the frequency divider is configured to:
  divide an input frequency by a divisor value;
  move the divisor value across an octave boundary on consecutive output cycles without suffering from a discontinuity; and
  utilize a synchronous divide-by-1 responsive to the divisor value transitioning across the octave boundary, wherein synchronous divide-by-1 entails passing an input clock through a D node of a first latch of a last divide-by-1/2/3 cell of the series.

9. The frequency divider as recited in claim 8, wherein the frequency divider further comprises a latch, an inverter gate, and a two-input OR gate corresponding to each divide-by-1/2/3 cell, and wherein each divide-by-1/2/3 cell is configured to:
  couple a Div1 port to a first input node of the corresponding two-input OR gate and to a Qb node of the corresponding latch;
  couple a $mod_{out}$ port to a second input node of the corresponding two-input OR gate and to an input node of the corresponding inverter gate;
  couple an output node of the corresponding inverter gate to a clock node of the corresponding latch;
  couple a P control signal to a D node of the corresponding latch; and
  couple a $mod_{in}$ port to an output node of the two-input OR gate corresponding to a subsequent cell in the series.

10. The frequency divider as recited in claim 9, wherein a $mod_{in}$ port of a last divide-by-1/2/3 cell in the series is coupled to a high logic level.

11. The frequency divider as recited in claim 9, wherein the frequency divider further comprises:
  two or more divide-by-1/2/3 cells; and
  a plurality of two-input OR gates cascaded together;
  wherein for each two-input OR gate of the plurality of two-input OR gates, the frequency divider is configured to:
    couple a D node of a corresponding latch to an output node of the two-input OR gate;
    couple a first input node of the two-input OR gate to a P control signal of a corresponding divide-by-1/2/3 cell; and
    couple a second input node of the two-input OR gate to a P control signal of a divide-by-1/2/3 cell subsequent to the corresponding divide-by-1/2/3 cell.

12. The frequency divider as recited in claim 9, wherein an effective range of possible divisor values N is determined by a formula $2^j \leq N \leq 2^{(i+1)}-1$, wherein j is an integer representing a number of divide-by-2/3 cells and wherein i is an integer representing a total number of divide-by-2/3 cells and divide-by-1/2/3 cells.

13. The frequency divider as recited in claim 9, wherein the frequency divider is further configured to receive an input programming word specifying the divisor value.

14. A circuit comprising:
  one or more divide-by-2/3 cells; and
  one or more divide-by-1/2/3 cells coupled to the one or more divide-by-2/3 cells;
  wherein the circuit is configured to:
    receive an input programming word, wherein the input programming word represents a divisor value and takes on one of a plurality of positive integer values;
    divide an input frequency by the divisor value; and
    responsive to the divisor value transitioning across an octave boundary on successive output cycles, correctly generate an output frequency on the successive output cycles, wherein the output frequency is equal to an input frequency divided by the divisor value.

15. The circuit as recited in claim 14, wherein the divisor value spans a range of more than one octave.

16. The circuit as recited in claim 14, wherein the one or more divide-by-2/3 cells and one or more divide-by-1/2/3 cells are cascaded together in a series, with the one or more divide-by-1/2/3 cells at an end of the series.

17. The circuit as recited in claim 15, wherein at least one divide-by-1/2/3 cell is configured to utilize a synchronous divide-by-1 mode on one of the successive output cycles.

18. The circuit as recited in claim 17, wherein synchronous divide-by-1 mode comprises passing an input clock through a D node of a first latch of the at least one divide-by-1/2/3 cell.

19. The circuit as recited in claim 18, wherein synchronous divide-by-1 mode further comprises connecting a logic '1' to a clock node of the first latch of the at least one divide-by-1/2/3 cell.

20. The circuit as recited in claim 15, wherein a range of possible divisor values N is determined by a formula $2^j \leq N \leq 2^{(i+1)}-1$, wherein j is an integer equal to a number of divide-by-2/3 cells and wherein i is an integer equal to a total number of divide-by-2/3 cells and divide-by-1/2/3 cells.

* * * * *

UNITED STATES PATENT AND TRADEMARK OFFICE
CERTIFICATE OF CORRECTION

PATENT NO. : 8,552,770 B2
APPLICATION NO. : 13/356995
DATED : October 8, 2013
INVENTOR(S) : Cavin It is certified that error appears in the above-identified patent and that said Letters Patent is hereby corrected as shown below:

In the Claims:

Claim 8, Column 13, Line 22, please delete "divide-by-1 responsive" and substitute -- divide-by-1 mode responsive --;
Claim 8, Column 13, Line 24, please delete "divide-by-1 entails" and substitute -- divide-by-1 mode entails --;
Claim 9, Column 13, Lines 29-30, please delete "divide-by-1/2/3cell" and substitute -- divide-by-1/2/3 cell --;
Claim 10, Column 13, Line 45, please delete "divide-by-1/2/3cell" and substitute -- divide-by-1/2/3 cell --;
Claim 18, Column 14, Line 42, please delete "divide-by-1mode" and substitute -- divide-by-1 mode --.

Signed and Sealed this
Nineteenth Day of November, 2013

Teresa Stanek Rea
*Deputy Director of the United States Patent and Trademark Office*